(12) United States Patent
Kawaguchi et al.

(10) Patent No.: US 10,797,077 B2
(45) Date of Patent: *Oct. 6, 2020

(54) THREE-DIMENSIONAL SEMICONDUCTOR MEMORY DEVICE INCLUDING SLIT WITH LATERAL SURFACES HAVING PERIODICITY

(71) Applicant: Toshiba Memory Corporation, Minato-ku (JP)

(72) Inventors: Genki Kawaguchi, Yokkaichi (JP); Masanari Fujita, Yokkaichi (JP); Hideki Inokuma, Yokkaichi (JP); Osamu Matsuura, Kuwana (JP); Takeshi Imamura, Yokkaichi (JP); Hideo Wada, Yokkaichi (JP); Makoto Watanabe, Oita (JP); Hajime Kaneko, Yokkaichi (JP); Kenichi Fujii, Yokkaichi (JP); Takanobu Itoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,981

(22) Filed: Dec. 3, 2019

(65) Prior Publication Data

US 2020/0111809 A1    Apr. 9, 2020

Related U.S. Application Data

(60) Continuation of application No. 16/042,424, filed on Jul. 23, 2018, now Pat. No. 10,541,251, which is a
(Continued)

(51) Int. Cl.
*H01L 27/11582*  (2017.01)
*H01L 27/11565*  (2017.01)

(52) U.S. Cl.
CPC .. *H01L 27/11582* (2013.01); *H01L 27/11565* (2013.01)

(58) Field of Classification Search
CPC .......... H01L 27/11582; H01L 27/1157; H01L 27/11578
See application file for complete search history.

(56) References Cited

U.S. PATENT DOCUMENTS 7,936,004 B2    5/2011    Kito et al.
8,436,414 B2    5/2013    Tanaka et al.
(Continued)

FOREIGN PATENT DOCUMENTS

JP    2007-266143    10/2007
JP    2010-187000    8/2010
(Continued)

*Primary Examiner* — Matthew E. Gordon
(74) *Attorney, Agent, or Firm* — Oblon, McClelland, Maier & Neustadt, L.L.P.

(57) ABSTRACT

According to one embodiment, it includes a stacked body including N-number of layers (N is an integer of 2 or more) stacked on a semiconductor substrate, opening portions penetrating the stacked body in a stacking direction, columnar bodies respectively disposed in the opening portions, and a slit dividing M-number of layers (M is an integer of 1 or more and (N–2) or less) of the stacked body in a horizontal direction from above, wherein the slit is formed with lateral surfaces respectively having a spatial periodicity in a horizontal plane.

8 Claims, 35 Drawing Sheets

Related U.S. Application Data division of application No. 15/257,613, filed on Sep. 6, 2016, now Pat. No. 10,074,665.

(60) Provisional application No. 62/217,381, filed on Sep. 11, 2015.

(56) References Cited

U.S. PATENT DOCUMENTS

| | | | |
|---|---|---|---|
| 8,436,416 B2 | 5/2013 | Ichinose et al. | |
| 8,551,838 B2 | 10/2013 | Kito et al. | |
| 8,614,917 B2 | 12/2013 | Shim et al. | |
| 8,644,046 B2 | 2/2014 | Seol et al. | |
| 8,729,622 B2 | 5/2014 | Moon et al. | |
| 8,748,971 B2 | 6/2014 | Tanaka et al. | |
| 8,803,222 B2 | 8/2014 | Lee et al. | |
| 8,987,805 B2 | 3/2015 | Nam et al. | |
| 9,064,735 B2 | 6/2015 | Kito et al. | |
| 9,111,963 B2 | 8/2015 | Murakami | |
| 9,196,627 B2 | 11/2015 | Konno et al. | |
| 10,074,665 B2 * | 9/2018 | Kawaguchi | H01L 27/11582 |
| 2012/0098049 A1 | 4/2012 | Moon | |
| 2012/0280303 A1 | 11/2012 | Kiyotoshi et al. | |
| 2014/0145255 A1 | 5/2014 | Seol et al. | |
| 2014/0284686 A1 | 9/2014 | Murakami | |
| 2015/0001460 A1 | 1/2015 | Kim et al. | |
| 2015/0255486 A1 | 9/2015 | Kameoka et al. | |
| 2015/0263035 A1 | 9/2015 | Tsuji et al. | |
| 2015/0372006 A1 | 12/2015 | Kito et al. | |
| 2016/0064407 A1 | 3/2016 | Kim | |
| 2016/0093631 A1 | 3/2016 | Yun | |
| 2017/0186769 A1 | 6/2017 | Son | |
| 2017/0194346 A1 | 7/2017 | Lee | |

FOREIGN PATENT DOCUMENTS

| | | |
|---|---|---|
| JP | 2010-192569 | 9/2010 |
| JP | 2011-108921 | 6/2011 |
| JP | 2012-234980 | 11/2012 |
| JP | 2014-187329 | 10/2014 |
| JP | 2015-28982 | 2/2015 |
| JP | 2015-170643 | 9/2015 |
| JP | 2015-177053 | 10/2015 |

* cited by examiner

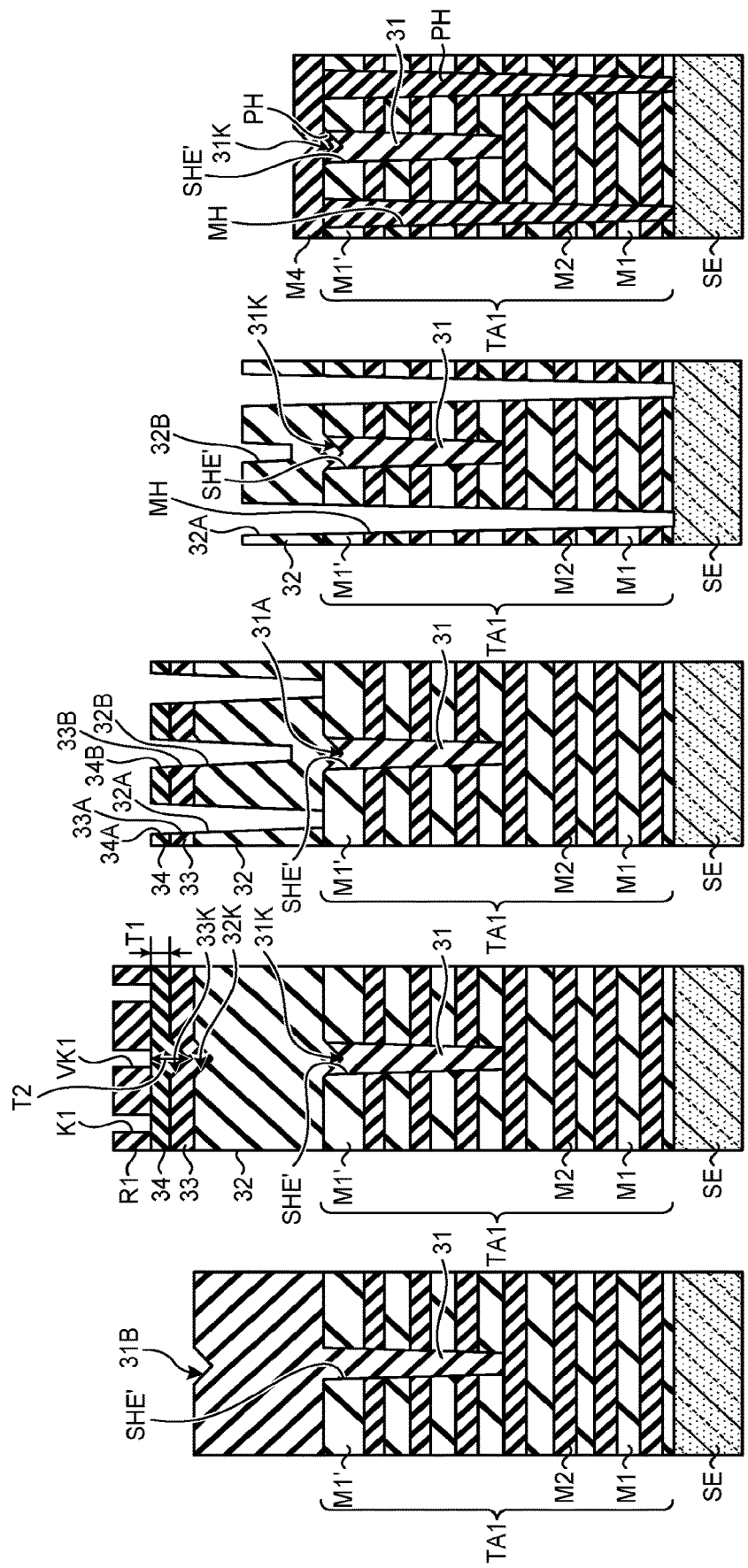

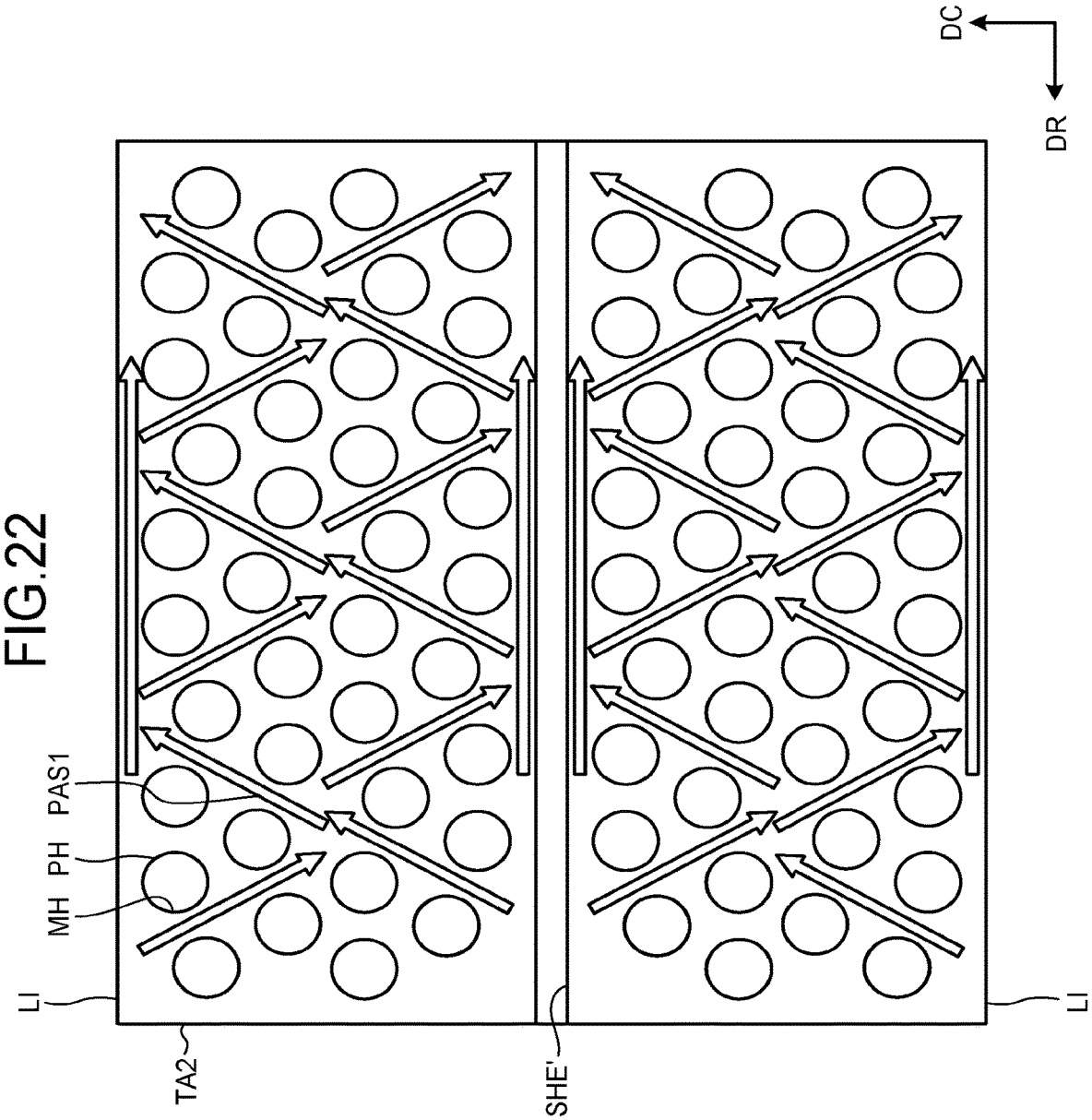

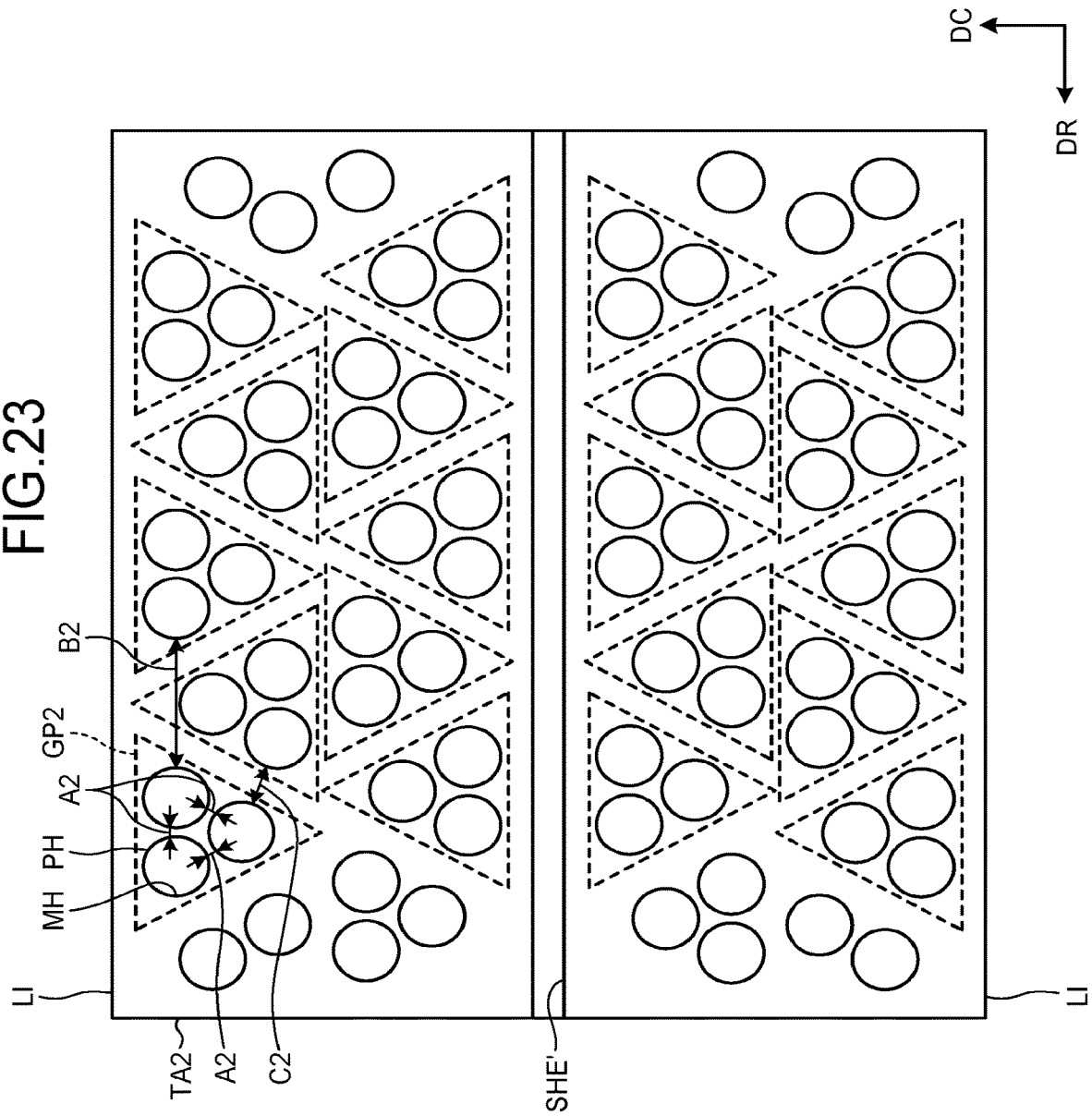

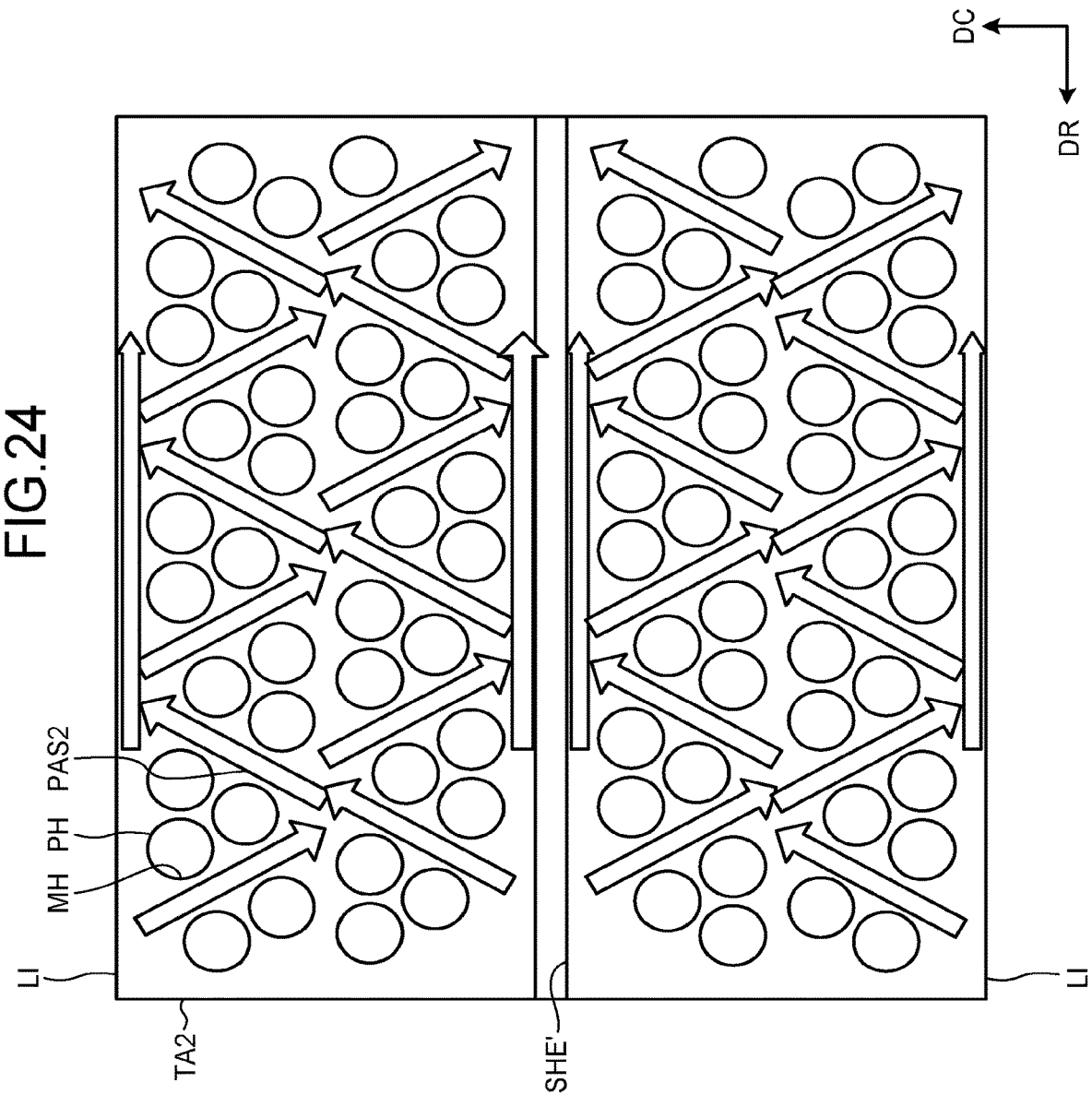

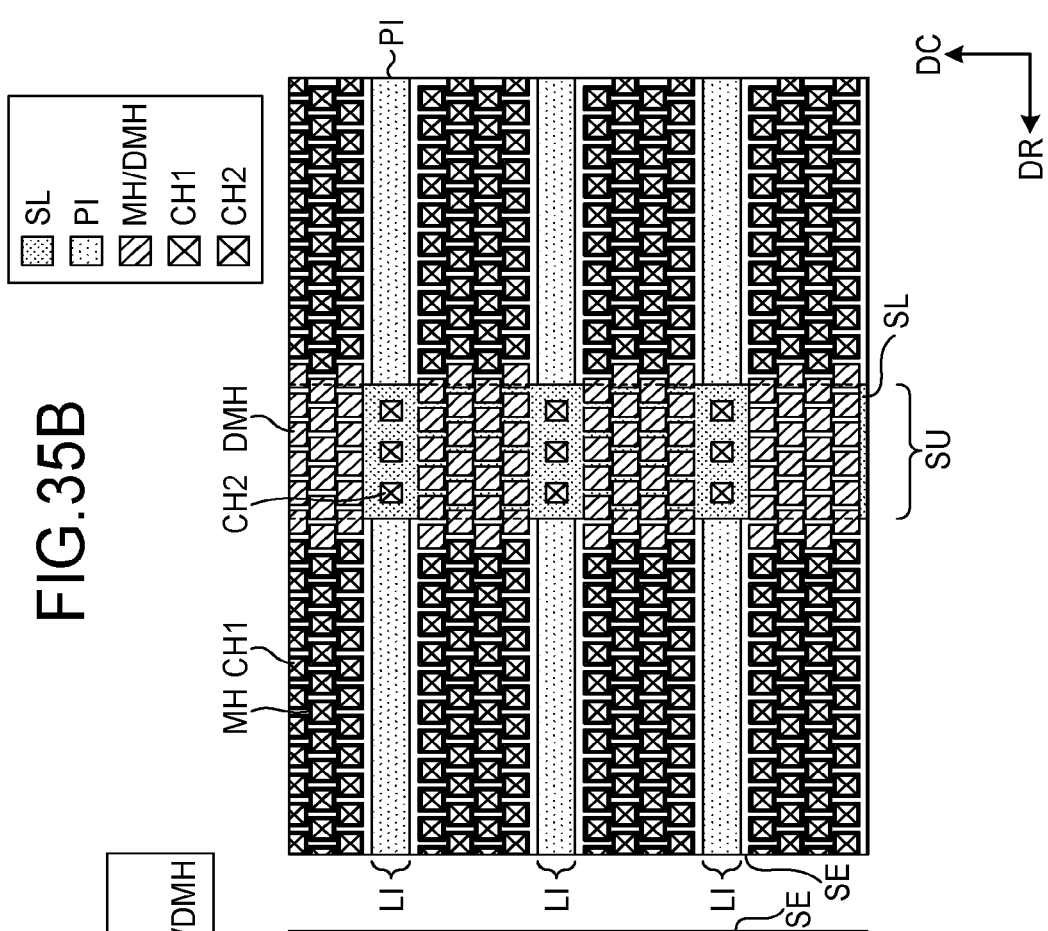
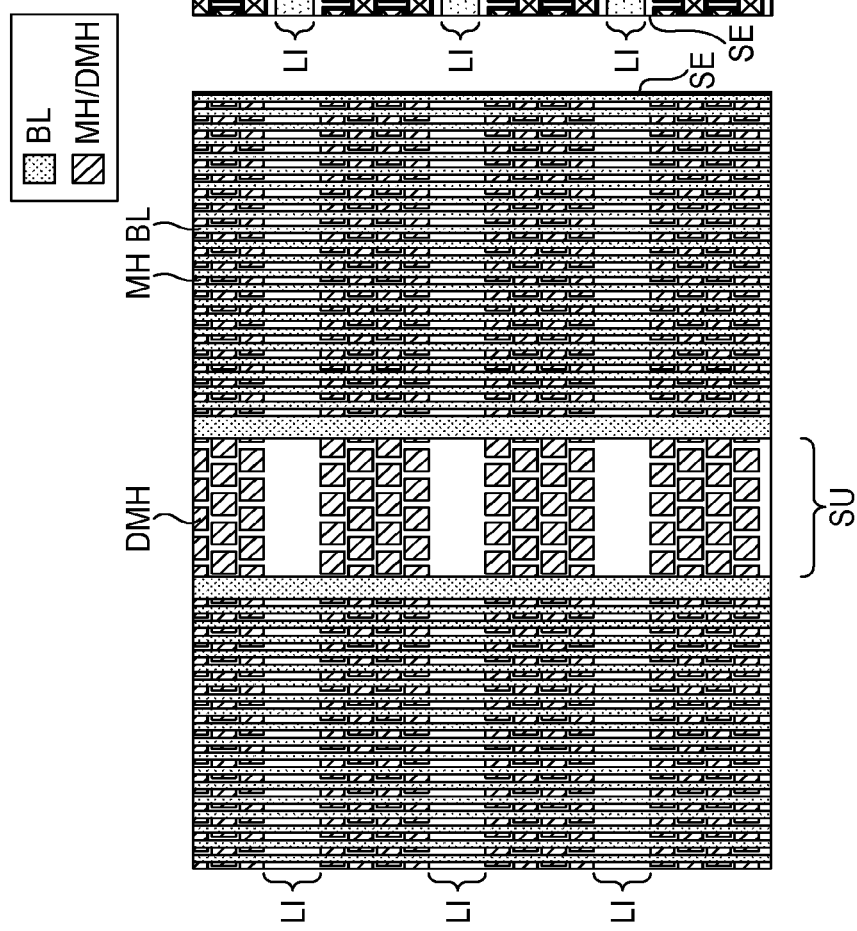
FIG.35A
FIG.35B

THREE-DIMENSIONAL SEMICONDUCTOR MEMORY DEVICE INCLUDING SLIT WITH LATERAL SURFACES HAVING PERIODICITY

CROSS-REFERENCE TO RELATED APPLICATIONS

This application is a continuation of U.S. application Ser. No. 16/042,424, filed on Jul. 23, 2018, which is a divisional of U.S. application Ser. No. 15/257,613, filed on Sep. 6, 2016, which is based upon and claims the benefit of priority from U.S. Provisional Application No. 62/217,381, filed on Sep. 11, 2015; the entire contents of each of which are incorporated herein by reference.

FIELD

Embodiments described herein relate generally to a semiconductor device, a non-volatile semiconductor memory device and a manufacturing method of a semiconductor device.

BACKGROUND

As a non-volatile semiconductor memory device, such as a NAND flash memory, there is a device in which memory cells are arranged in a three-dimensional state to increase the capacity per chip.

BRIEF DESCRIPTION OF THE DRAWINGS

FIGS. 18A to 18E are sectional views showing a manufacturing method of a non-volatile semiconductor memory device according to a seventh embodiment;

FIG. 22 is a plan view showing entering routes of conductive bodies in the step shown in FIG. 21B in association with arrangement of the memory holes shown in FIG. 19;

FIG. 23 is a plan view showing an arrangement example of memory holes of a non-volatile semiconductor memory device according to a ninth embodiment;

FIG. 24 is a plan view showing entering routes of conductive bodies in the step shown in FIG. 21B in association with arrangement of the memory holes shown in FIG. 23;

FIGS. 35A and 35B are plan views showing an arrangement method of memory holes of a non-volatile semiconductor memory device according to a 20th embodiment.

DETAILED DESCRIPTION

In general, according to one embodiment, it includes a stacked body including N-number of layers (N is an integer of 2 or more) stacked on a semiconductor substrate, opening portions penetrating the stacked body in a stacking direction, columnar bodies respectively disposed in the opening portions, and a slit dividing M-number of layers (M is an integer of 1 or more and (N–2) or less) of the stacked body in a horizontal direction from above. The slit is formed with lateral surfaces respectively having a spatial periodicity in a horizontal plane.

Exemplary embodiments of a non-volatile semiconductor memory device and a manufacturing method of a non-volatile semiconductor memory device will be explained below in detail with reference to the accompanying drawings. In the following description, a semiconductor device is exemplified by a nonvolatile semiconductor memory device. The present invention is not limited to the following embodiments.

First Embodiment

Figure 1:
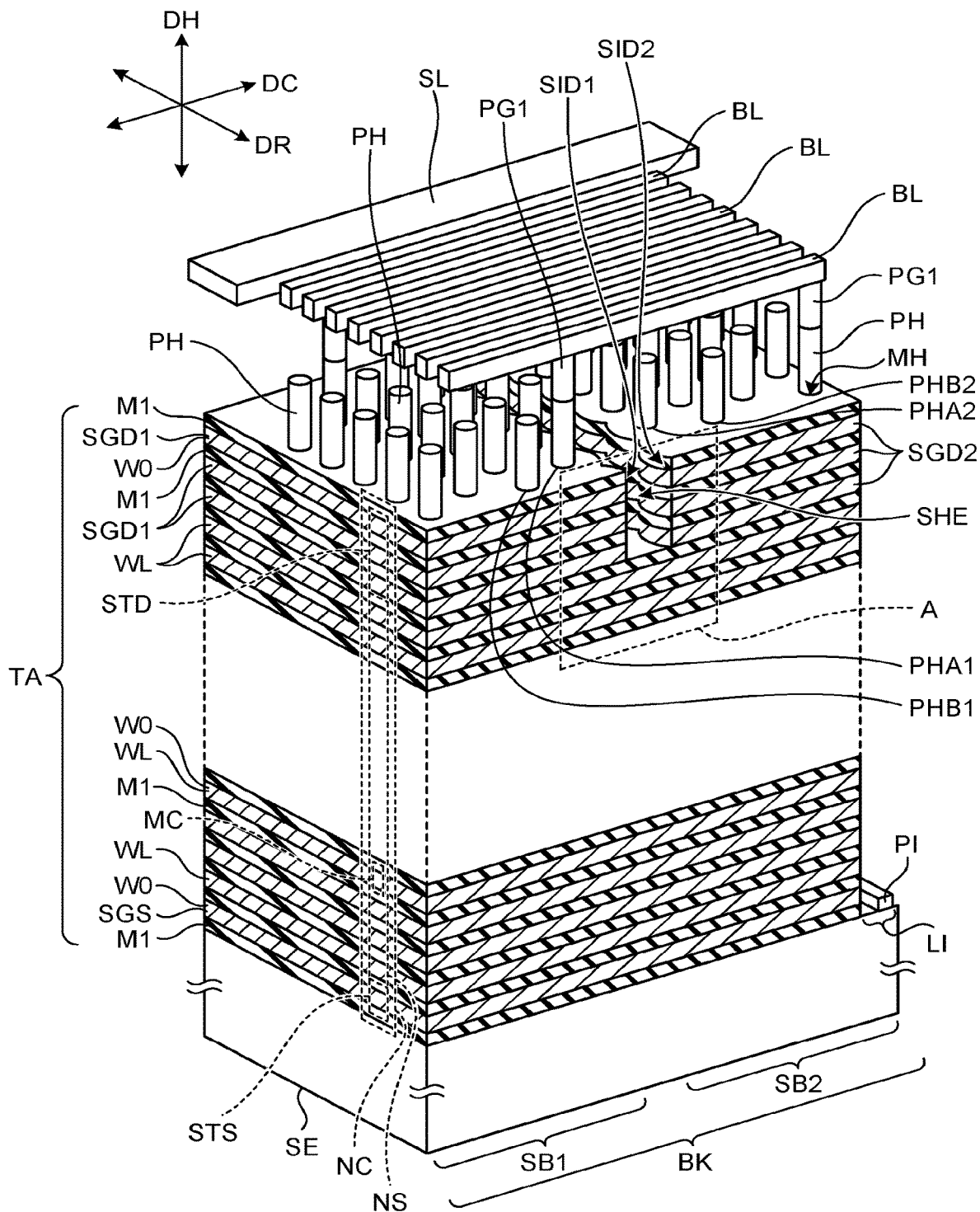
FIG. 1 is a perspective view showing a schematic configuration of a block of a non-volatile semiconductor memory device according to a first embodiment.
Figure 2:
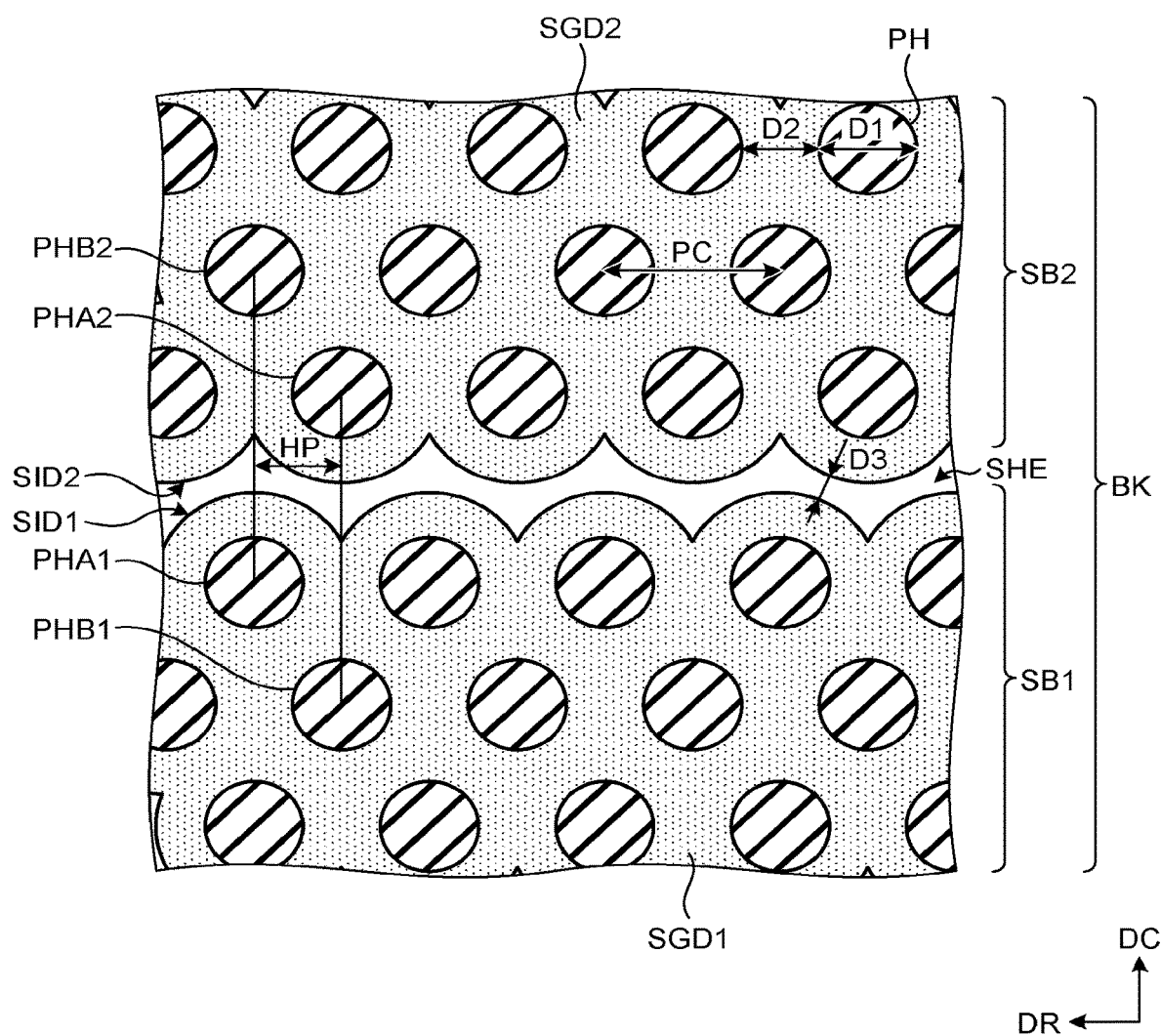
FIG. 2 is a plan view showing a configuration example of selection gate electrodes shown in FIG. 1.

FIG. 1 is a perspective view showing a schematic configuration of a block of a non-volatile semiconductor memory device according to a first embodiment. FIG. 2 is a plan view showing a configuration example of selection gate electrodes shown in FIG. 1.

As shown in FIG. 1, a stacked body TA is disposed on a semiconductor substrate SE, and is formed such that a conductive layer W0 and an insulating layer M1 are alternately stacked in a stacking direction DH. In this case, the stacked body TA may have a stacked structure in which N-number of conductive layers W0 (N is an integer of 2 or more) are stacked with insulating layers M1 respectively interposed therebetween. In the stacked body TA, memory holes MH are formed to penetrate the stacked body TA in the stacking direction DH. Columnar bodies PH are respectively embedded in the memory holes MH. Each columnar body PH may be provided with a memory film for storing data. A method of storing data may employ polarization of the memory film, or employ an electric charge accumulated in the memory film. The memory film may be formed of a charge trap film, or formed of a floating gate.

Here, if the charge trap film is used for the memory film, the charge trap film may be continuously disposed in association with all the memory cells MC accompanying each columnar body PH. If the floating gate is used for the memory film, floating gates may be separately disposed in association with the respective memory cells MC accompanying each columnar body PH. In the stacked body TA, a slit SHE is formed such that M-number of conductive layers W0 (M is an integer of 1 or more and (N–2) or less) from the uppermost layer are thereby divided in a column direction DC. The slit SHE is formed with lateral surfaces SID1 and SID2 respectively at positions that may have a spatial periodicity in a horizontal plane defined by two axes in a row direction DR and the column direction DC. In this case, each of the lateral surfaces SID1 and SID2 of the slit SHE may be present along part of the outer peripheries of columnar bodies PH.

Here, the lowermost layer of the conductive layers W0 may be used as a selection gate electrode SGS. The M-number of conductive layers W0 from the uppermost layer may be used as selection gate electrodes SGD1 and SGD2. The selection gate electrodes SGD1 and SGD2 are separated from each other by the slit SHE. Here, in the example shown in FIG. 1, three layers of the conductive layers W0 from the uppermost layer are used as the selection gate electrodes SGD1 and SGD2, but one layer of the conductive layers W0 from the uppermost layer may be used as the selection gate electrodes SGD1 and SGD2. The conductive layers W0 between the selection gate electrode SGS and the selection gate electrodes SGD1 and SGD2 may be used as word lines WL. Here, a sub block SB1 is constituted by the selection gate electrode SGS, the word lines WL, and the selection gate electrode SGD1.

A sub block SB2 is constituted by the selection gate electrode SGS, the word lines WL, and the selection gate electrode SGD2. A block BK is constituted by the sub blocks SB1 and SB2. The block BK may define an erasure unit in a NAND flash memory. Each layer of each of the sub blocks SB1 and SB2 may define a write unit or read unit in the NAND flash memory. Here, the selection gate electrodes SGD1 and SGD2 are separated from each other for the respective sub blocks SB1 and SB2, so that the sub blocks SB1 and SB2 can be individually selected even though the word lines WL are shared by the sub blocks SB1 and SB2.

The selection gate electrode SGS, the word lines WL, and the selection gate electrodes SGD1 and SGD2 are isolated by a slit LI to each block BK in the column direction DC. In the slit LI, a conductor plate PI is disposed. The conductor plate PI is connected to the semiconductor substrate SE, so that the electric potential of the semiconductor substrate SE can be set.

Here, in association with each columnar body PH, memory cells MC are respectively formed between the word lines WL and the columnar body PH. In this respect, memory cells MC may be arranged in a three-dimensional state within a space defined by three axes in the row direction DR, the column direction DC, and the stacking direction DH. Further, a selection transistor STS is formed in association with each columnar body PH between itself and the selection gate electrode SGS. Further, a selection transistor STD is formed in association with each columnar body PH between itself and the selection gate electrode SGD1 or SGD2.

Furthermore, the memory cells MC are connected in series in the stacking direction DH, so that a NAND string NS is constituted. The selection transistor STS, the NAND string NS, and the selection transistor STD are connected in series in the stacking direction DH, so that a NAND cell NC is constituted. NAND cells NC are arranged at a predetermined pitch in the row direction DR and the column direction DC. Here, as shown in FIG. 2, the sub block SB1 includes columnar bodies PHA1 and PHB1. The columnar bodies PHA1 and PHB1 are arranged at a pitch PC in the row direction DR, in a state where the respective groups are shifted from each other by a half pitch HP in the row direction DR.

In this case, the columnar bodies PHA1 and PHB1 may be arranged in a staggered lattice pattern within the sub block SB1. Alternatively, the columnar bodies PHA1 and PHB1 may be arranged in a square lattice pattern within the sub block SB1. The sub block SB2 includes columnar bodies PHA2 and PHB2. The columnar bodies PHA2 and PHB2 are arranged at a pitch PC in the row direction DR, in a state where the respective groups are shifted from each other by the half pitch HP in the row direction DR. In this case, the columnar bodies PHA2 and PHB2 may be arranged in a staggered lattice pattern within the sub block SB2. Alternatively, the columnar bodies PHA2 and PHB2 may be arranged in a square lattice pattern within the sub block SB2.

Further, the columnar bodies PHA1 and PHA2 are disposed opposite to each other with the slit SHE interposed therebetween and are shifted from each other by the half pitch HP in the row direction DR. The minimum value D3 of the width of the slit SHE may be set smaller than the distance D2 between columnar bodies PH. In this case, the diameter D1 of each columnar body PH may be set to about 90 to 110 nm. The distance D2 between columnar bodies PH may be set to about 40 to 60 nm. The minimum value D3 of the width of the slit SHE may be set to about 40 nm or less. In this case, the lateral surfaces SID1 and SID2 of the slit SHE may respectively have waveform shapes that are shifted from each other in phase by the half pitch HP in the row direction DR and have a spatial period equal to the pitch PC. Further, the lateral surface SID1 of the slit SHE may be made closer to a direction between the columnar bodies PHA1 and PHB1.

The lateral surface SID2 of the slit SHE may be made closer to a direction between the columnar bodies PHA2 and PHB2. Here, the lateral surfaces SID1 and SID2 of the slit SHE are arranged along the outer peripheries of columnar bodies PH, so that the distance between the sub blocks SB1 and SB2 in the column direction DC becomes smaller, and the integration degree of the memory cells MC can thereby be improved, as compared with a case that the slit SHE is arranged linearly in the row direction DR.

Plug electrodes PG1 are respectively disposed on the columnar bodies PH. Bit lines BL and a source line SL are disposed above the stacked body TA. The bit lines BL extend in the column direction DC and are separated from each other in the row direction DR. The bit lines BL are connected to the columnar bodies PH respectively through the plug electrodes PG1. A plurality of bit lines BL may extend across above the columnar bodies PH in the column direction DC. In this case, each bit line BL may be connected to only one of the columnar bodies PH in each of the sub blocks SB1 and SB2. Consequently, for example, even if one word line WL is shared by all the memory cells MC in each layer of the sub block SB1, only one memory cell MC can be selected in each layer of the sub block SB1. Thus, for example, in one sub block SB1, the selection gate electrode SGD1 and the word lines WL are not required to be divided, and the integration degree of the memory cells MC can thereby be improved.

Here, as the material of the semiconductor substrate SE, single-crystalline silicon or the like may be used. As the material of the insulating layers M, $SiO_2$ or the like may be used. Each insulating layer M1 may be replaced with an air gap. As the material of the plug electrodes PG1, amorphous silicon, poly-crystalline, or the like may be used. The plug electrodes PG1 may be doped with an impurity, such as boron. It should be noted that, the embodiment described above illustrates a configuration in which one block BK is composed of the two sub blocks SB1 and SB2, but one block BK may be composed of three or more sub blocks.

Second Embodiment

FIGS. 3A to 3D, 4A to 4D, and 5A to 5C are sectional views showing a manufacturing method of a non-volatile semiconductor memory device according to a second embodiment. Here, each of FIGS. 3A to 3D, 4A to 4D, and 5A to 5C shows the portion A of FIG. 1 in an extracted state.

Figure 3A:
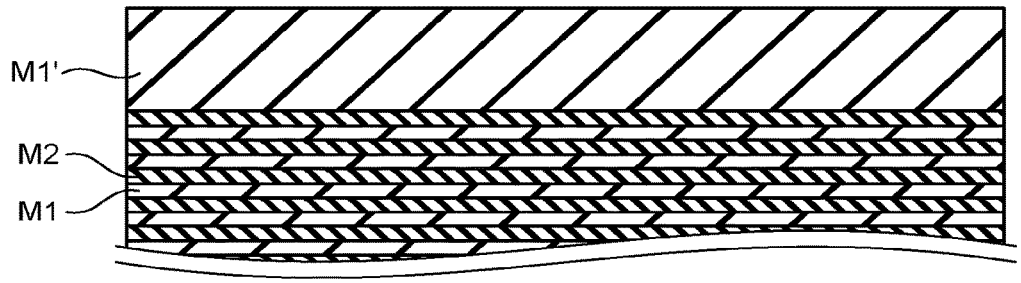
FIGS. 3A to 3D are sectional views showing a manufacturing method of a non-volatile semiconductor memory device according to a second embodiment.

As shown in FIG. 3A, insulating layers M1 and M2 are alternately stacked by use of a CVD method or the like. Further, an insulating layer M1' is stacked on the uppermost layer of the insulating layers M2 by use of a CVD method or the like. Here, as the material of the insulating layers M1 and M1', $SiO_2$ may be used, and, as the material of the insulating layers M2, SiN may be used.

Figure 3B:
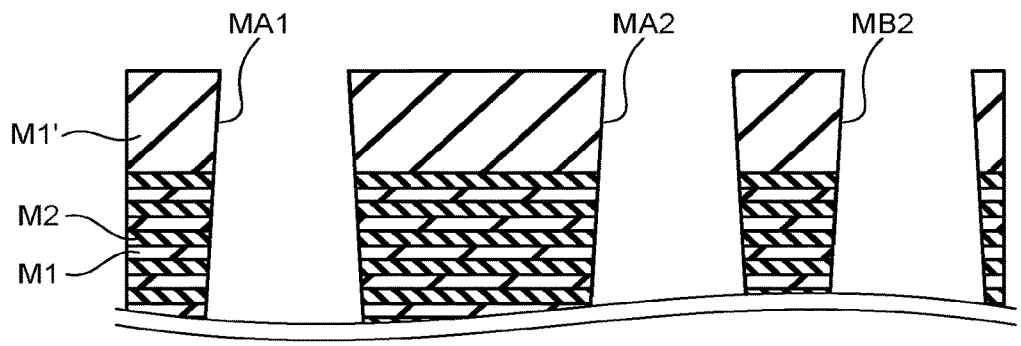

Then, as shown in FIG. 3B, memory holes MA1, MA2, and MB2 are formed to penetrate the insulating layers M1, M1', and M2 by use of a lithography technique and a dry etching technique.

Figure 3C:
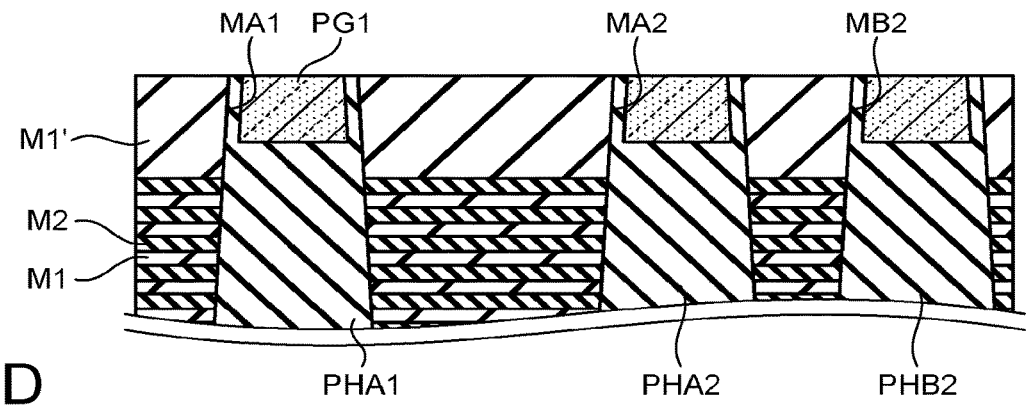

Then, as shown in FIG. 3C, by use of a CVD method or the like, columnar bodies PHA1, PHA2, and PHB2 are respectively embedded into the memory holes MA1, MA2, and MB2. Further, the inside of each of the columnar bodies PHA1, PHA2, and PHB2 is recessed downward, and a plug electrode PG1 is embedded into this recessed portion.

Figure 3D:
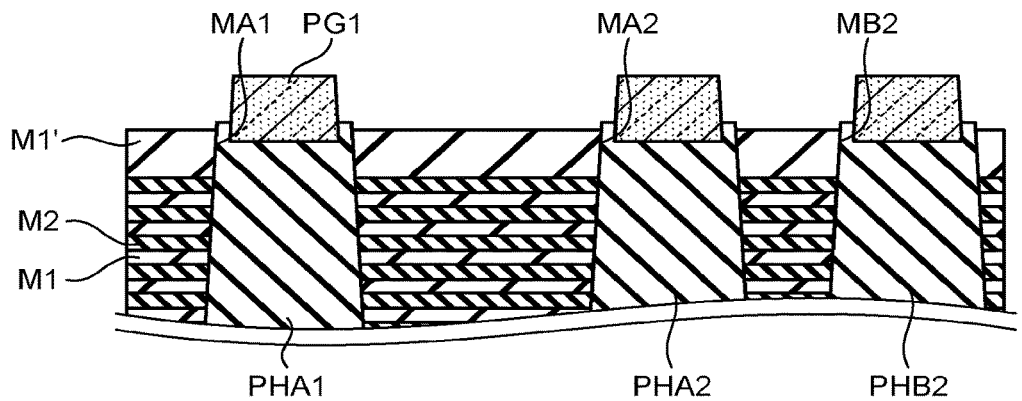

Then, as shown in FIG. 3D, wet etching is performed to the entire surface of the insulating layer M1', so that the film thickness of the insulating layer M1' is reduced. At this time, the tips of the respective plug electrodes PG1 and the tips of the respective columnar bodies PHA1, PHA2, and PHB2 may be made to protrude above the insulating layer M1'.

Figure 4A:
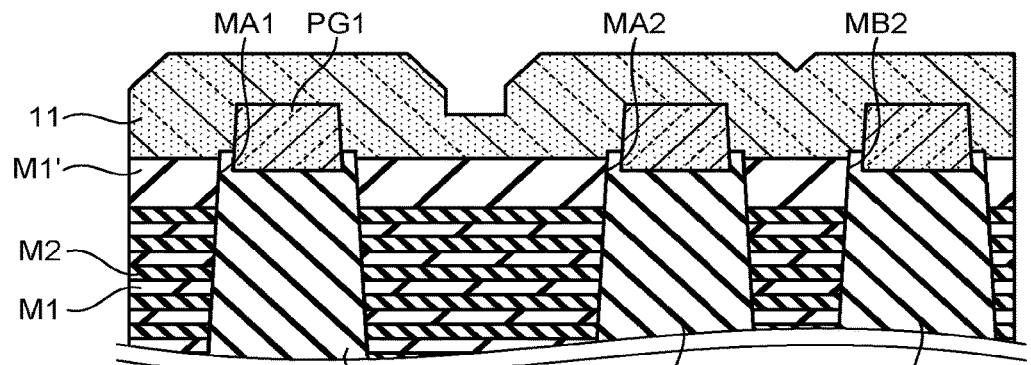
FIGS. 4A to 4D are sectional views showing the manufacturing method of a non-volatile semiconductor memory device according to the second embodiment.
Figure 4B:
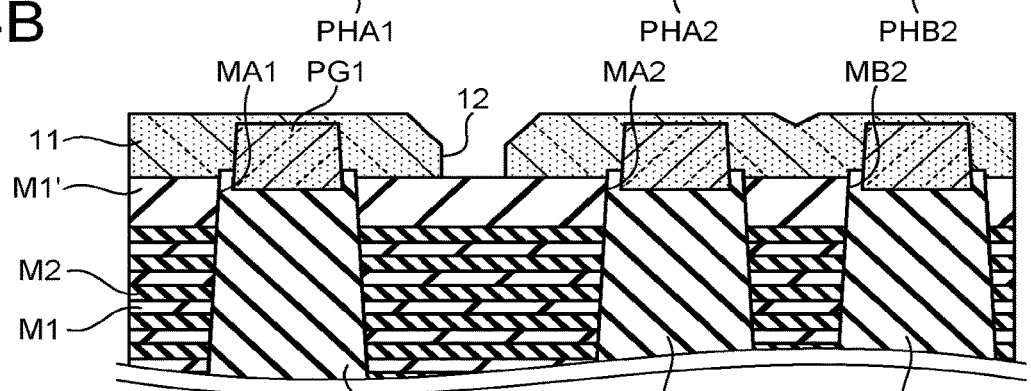

Then, as shown in FIG. 4A, a mask layer 11 is formed on the insulating layer M1' by use of a CVD method or the like. At this time, the mask layer 11 may cover the tips of the respective plug electrodes PG1 and the tips of the respective columnar bodies PHA1, PHA2, and PHB2. As the material of the mask layer 11, non-doped amorphous silicon or the like may be used.

Figure 4C:
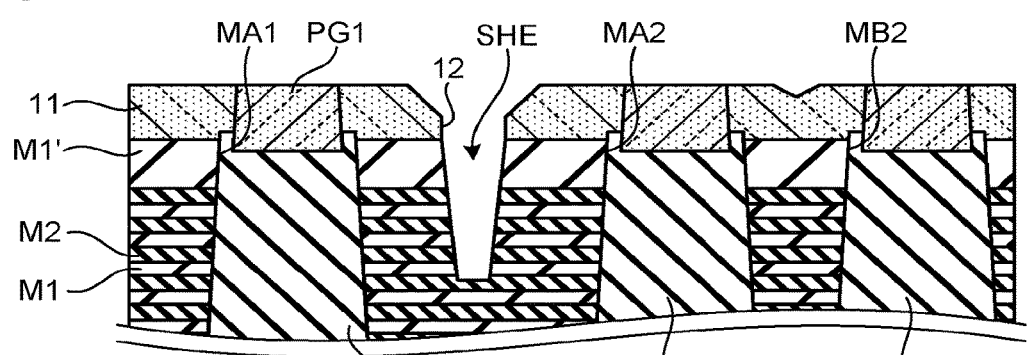
Figure 4D:
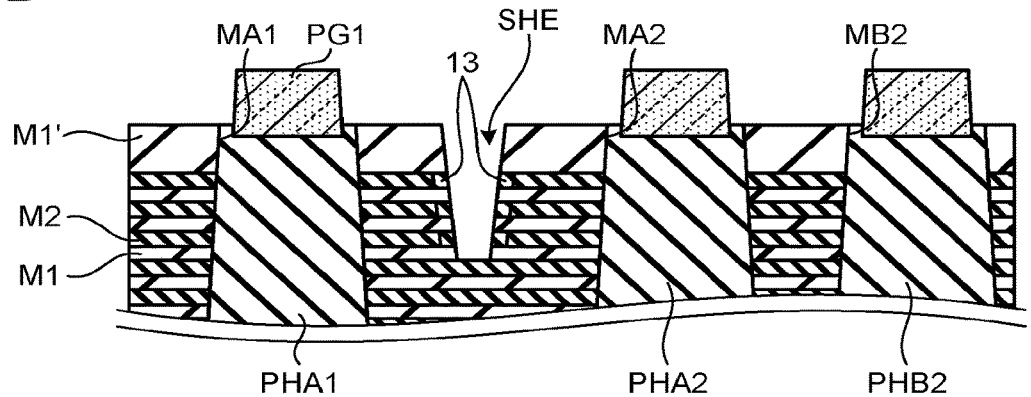

Then, as shown in FIG. 4D, the film thickness of the mask layer 11 is reduced by use of an anisotropic etching technique, such as RIE, until the part of the mask layer 11 between the columnar bodies PHA1 and PHA2 is exposed. Here, when the part of the mask layer 11 between the columnar bodies PHA1 and PHA2 is exposed, the mask layer 11 is left on the tips of the respective plug electrodes PG1 and on the sidewalls of the respective columnar bodies PHA1, PHA2, and PHB2. At this time, a slit 12, by which the part of the mask layer 11 between the columnar bodies PHA1 and PHA2 is exposed, is formed in the mask layer 11 in a self-alignment manner.

Then, as shown in FIG. 4C, the insulating layers M1, M1', and M2 are etched through the mask layer 11 including the slit 12 formed therein, so that a slit SHE is formed in the insulating layers M1, M1', and M2. At this time, for example, the etching may be stopped when the upper three layers of the insulating layers M2 have been etched.

Then, as shown in FIG. 4D, the mask layer 11 is removed. Then, the sidewalls of the insulating layers M2 exposed by the slit 12 are oxidized, so that an oxide film 13 is formed on the sidewalls of the insulating layers M2.

Figure 5A:
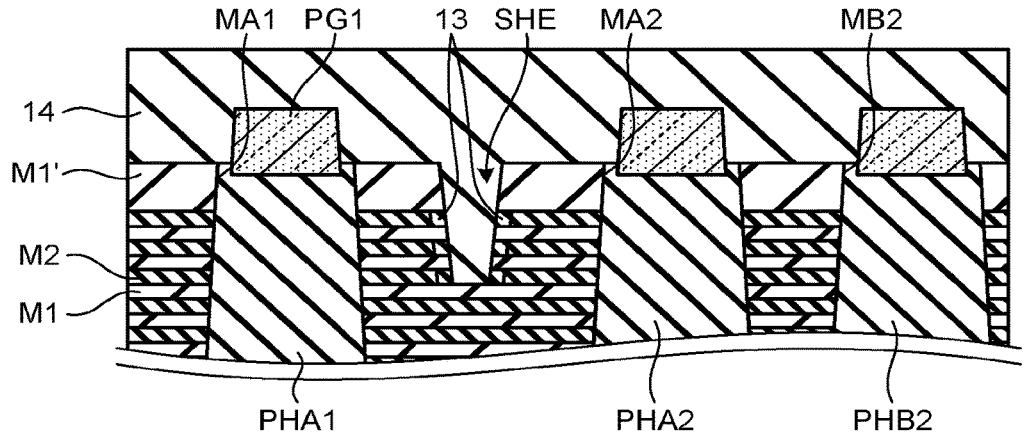
FIGS. 5A to 5C are sectional views showing the manufacturing method of a non-volatile semiconductor memory device according to the second embodiment.

Then, as shown in FIG. 5A, an insulating layer 14 is formed on the insulating layer M1' by use of a CVD method or the like, such that the insulating layer 14 fills the slit 12. As the material of the insulating layer 14, a TEOS film or the like may be used. Thereafter, the slit LI shown in FIG. 1 may be formed in the insulating layers M1, M1', M2, and 14.

Figure 5B:
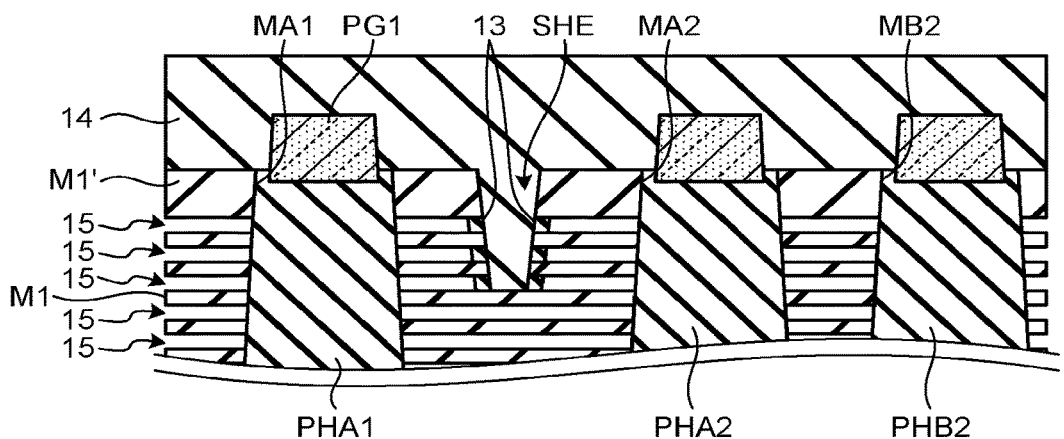

Then, as shown in FIG. 5B, the insulating layers M2 are selectively etched by use of a wet etching method or the like, so that the insulating layers M2 are removed, and gap spaces 15 are thereby formed between the insulating layers M1 and below the insulating layer M1'. Here, in the case that the insulating layers M2 are made of SiN, hot phosphoric acid may be used as a chemical liquid. At this time, the chemical liquid can flow into the positions of the insulating layers M2 through the slit LI.

Figure 5C:
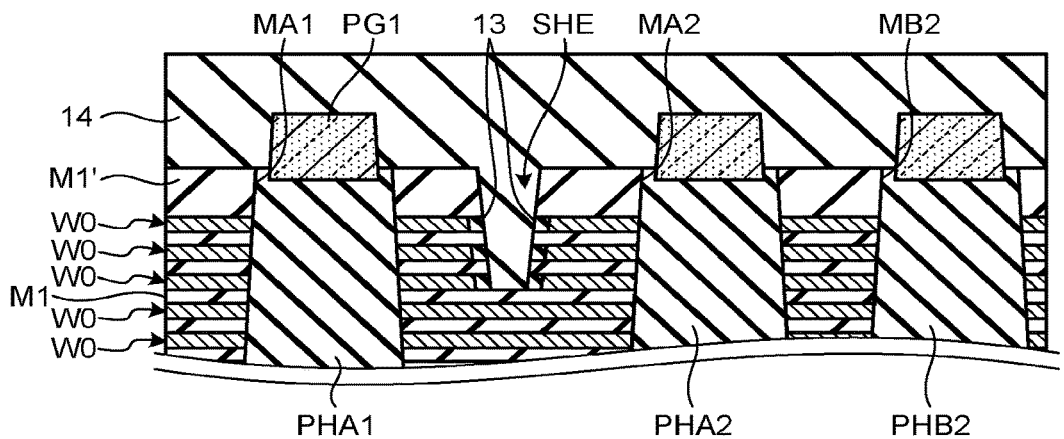

Then, as shown in FIG. 5C, conductive layers W0 are respectively embedded into the gap spaces 15 by use of an ALD-CVD method or the like. As the material of the conductive layers W0, for example, a metal, such as W, may be used.

Here, the slit 12 for forming the slit SHE in the insulating layers M1, M1', and M2 is formed in the mask layer 11 in a self-alignment manner, and so there is no need to secure a margin in consideration of misalignment in positioning a mask. Consequently, as compared with a method of forming the slit 12 by use of lithography, the distance between the sub blocks SB1 and SB2 can be set narrower, and the integration degree of the memory cells MC can thereby be improved.

Third Embodiment

Figure 6:
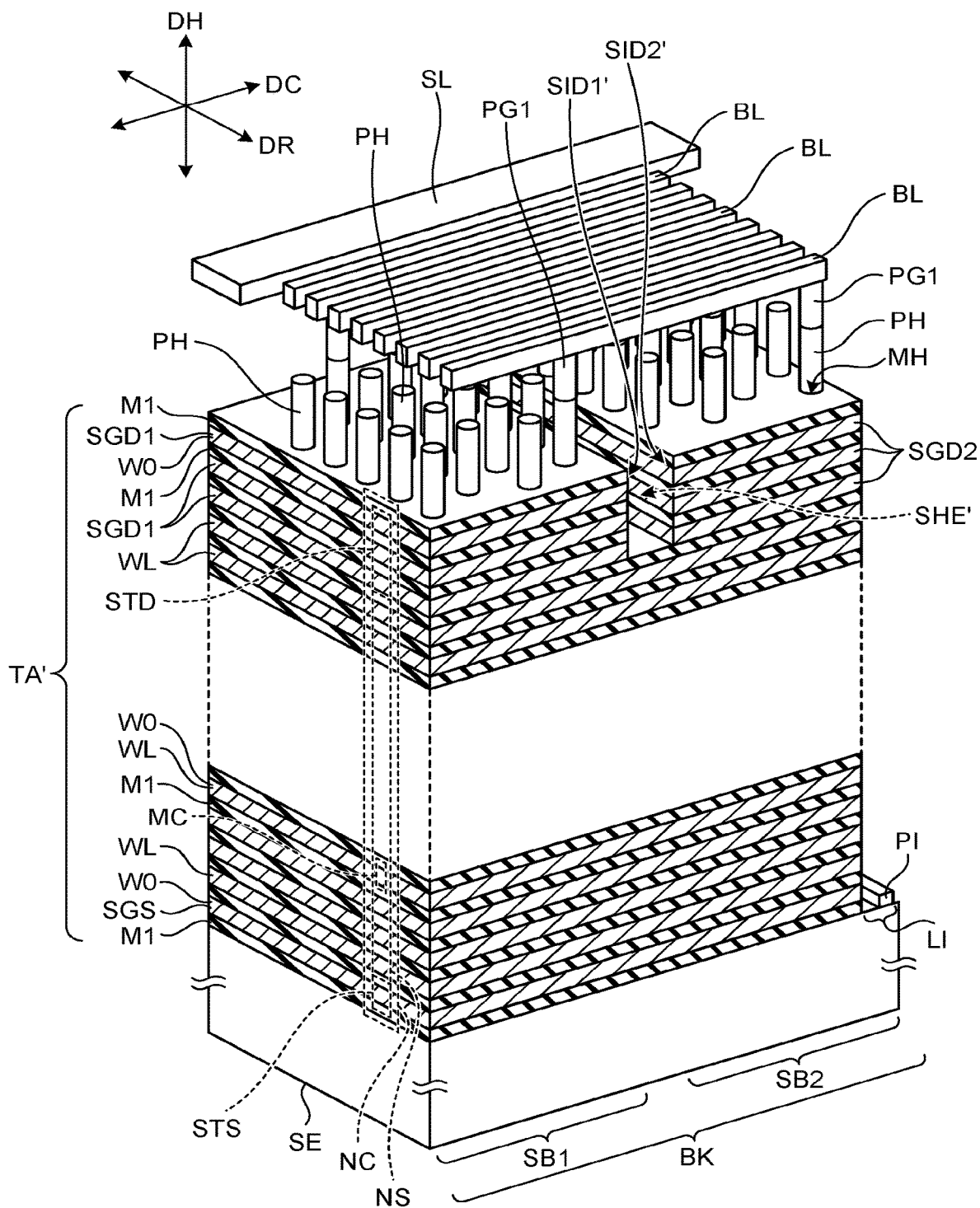
FIG. 6 is a perspective view showing a schematic configuration of a block of a non-volatile semiconductor memory device according to a third embodiment.

FIG. 6 is a perspective view showing a schematic configuration of a block of a non-volatile semiconductor memory device according to a third embodiment.

As shown in FIG. 6, a stacked body TA' is disposed, in place of the stacked body TA shown in FIG. 1, on a semiconductor substrate SE. In the stacked body TA', a slit SHE' is formed in place of the slit SHE. Other than that the slit SHE' is formed in place of the slit SHE, the stacked body TA' may be configured as in the stacked body TA. The slit SHE shown in FIG. 1 has been exemplified by a case where its lateral surfaces SID1 and SID2 respectively have waveform shapes, but the slit SHE' shown in FIG. 6 may be configured such that its lateral surfaces SID1' and SID2' are flat.

FIGS. 7A, 8A, 9A, 13A, and 10 to 12 are sectional views showing a manufacturing method of a non-volatile semiconductor memory device according to the third embodiment, and FIGS. 7B, 8B, 9B, and 13B are plan views showing the manufacturing method of a non-volatile semiconductor memory device according to the third embodiment. Here, FIGS. 7A, 8A, 9A, and FIG. 13A are sectional views taken along a line A-A' of FIGS. 7B, 8B, 9B, and 13B, respectively.

Figure 7A:
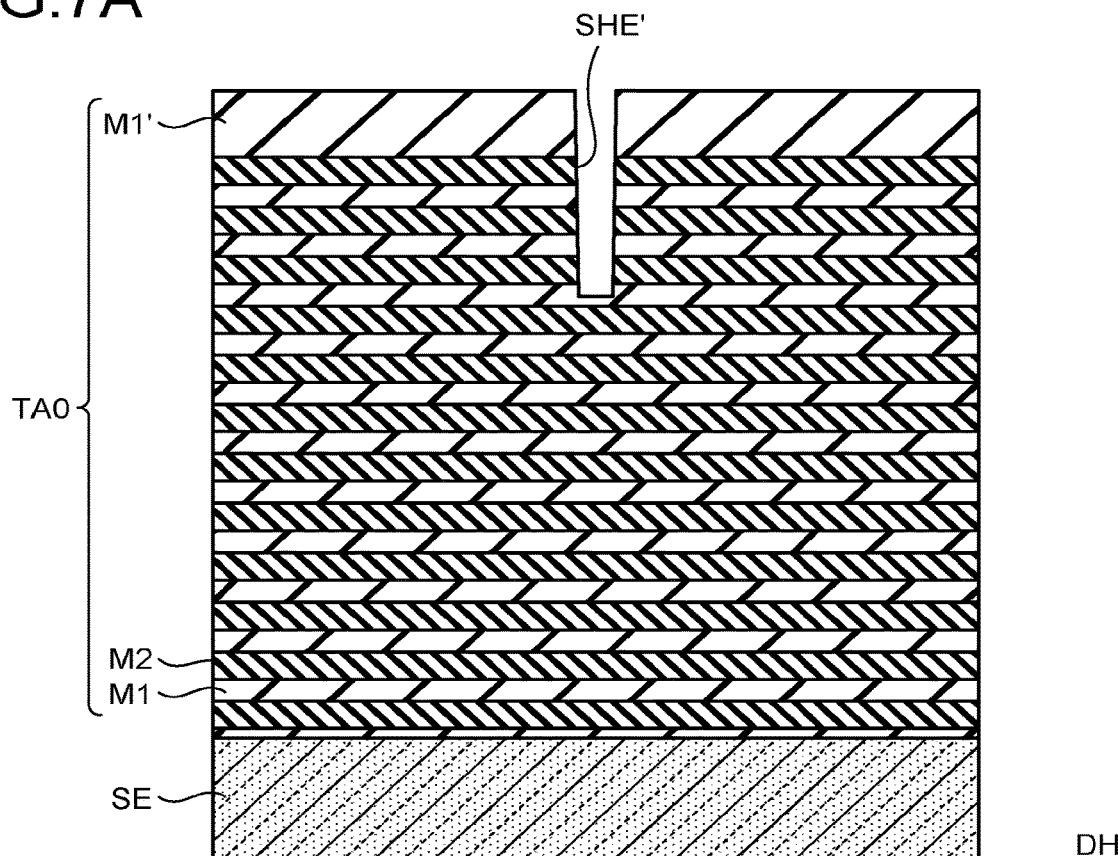
FIG. 7A is a sectional view showing a manufacturing method of a non-volatile semiconductor memory device according to the third embodiment.
Figure 7B:
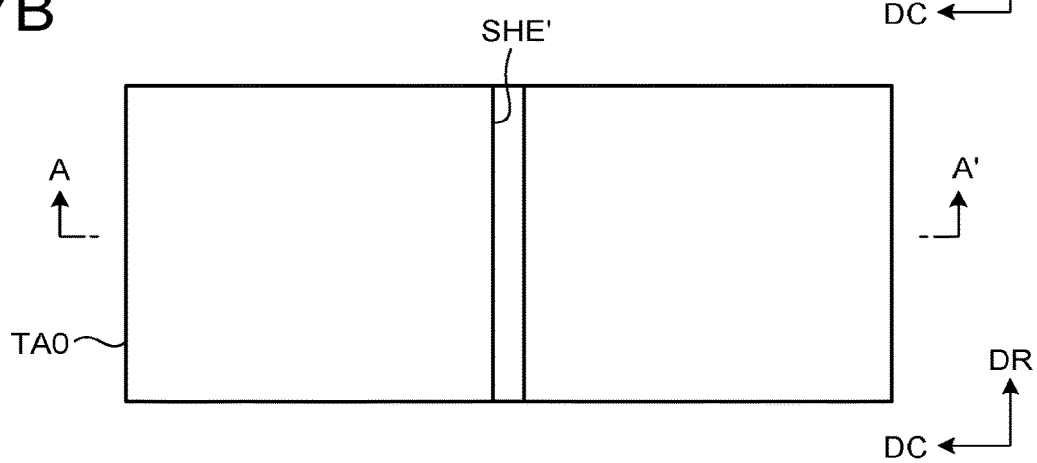
FIG. 7B is a plan view showing the manufacturing method of a non-volatile semiconductor memory device according to the third embodiment.

As shown in FIGS. 7A and 7B, insulating layers M1 and M2 are alternately stacked on a semiconductor substrate SE by use of a CVD method or the like. Further, an insulating layer M1' is stacked on the uppermost layer of the insulating layers M2 by use of a CVD method or the like. Here, as the material of the insulating layers M1 and M1', $SiO_2$ may be used, and, as the material of the insulating layers M2, SiN may be used. The insulating layers M1, M1', and M2 may compose a stacked body TA0. The number of insulating layers M1 and M2 may be set to about several tens to several hundreds, for example. The semiconductor substrate SE may include an integrated circuit and/or wiring lines formed thereon.

Then, a slit SHE' is formed in the stacked body TA0 by use of a photolithography technique and a dry etching technique. At this time, the etching of the stacked body TA0 may be stopped when the slit SHE' penetrates the third layer of the insulating layers M2 from the top.

Figure 8A:
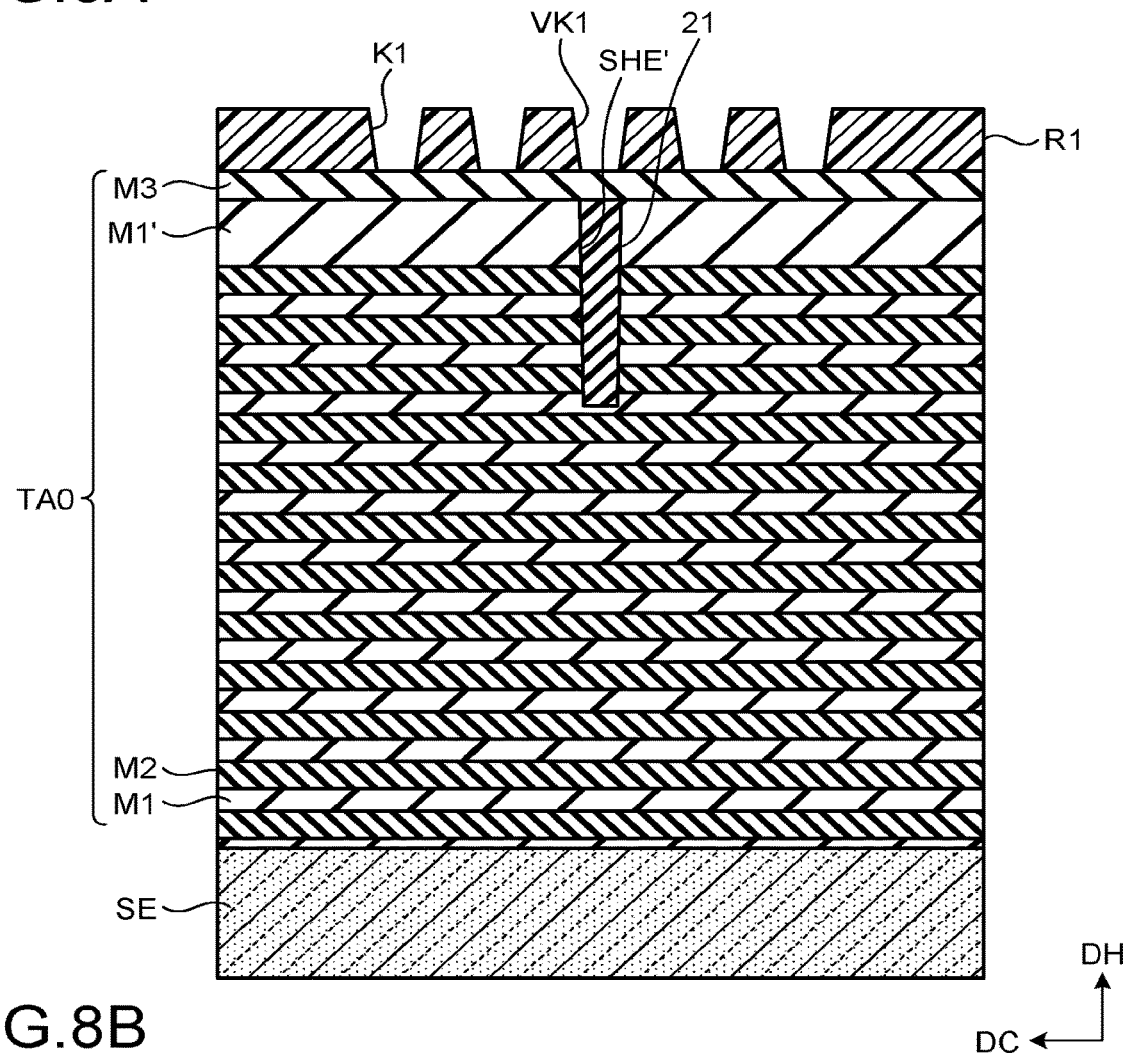
FIG. 8A is a sectional view showing the manufacturing method of a non-volatile semiconductor memory device according to the third embodiment.
Figure 8B:
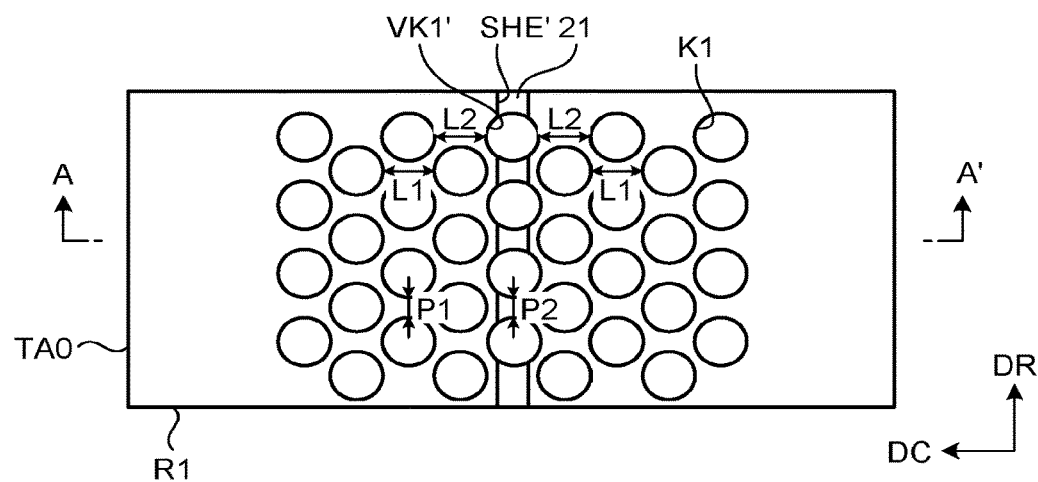
FIG. 8B is a plan view showing the manufacturing method of a non-volatile semiconductor memory device according to the third embodiment.

Then, as shown in FIGS. 8A and 8B, a filling film 21 is formed in the slit SHE' by use of a CVD method or the like. The filling film 21 may be made of a material having an etching rate lower than those of the insulating layers M1, M1', and M2. As the material of the filling film 21, one or more of an insulating film, conductive film, and semiconductor film may be selected. For example, where the material of the insulating layer M1' is $SiO_2$, and the material of the insulating layers M2 is SiN, one or more of TaO, HfO, Si, Cu, and W may be selected. Then, the film thickness of the filling film 21 is reduced by use of a CMP or etching-back method, until the surface of the insulating layer M1' is exposed. Further, an insulating layer M3 is formed on the filling film 21 by use of a CVD method or the like. As the material of the insulating layer M3, for example, $SiO_2$ may be used.

Then, a resist pattern R1 is formed on the insulating layer M3 by use of a photolithography technique. The resist pattern R1 includes opening portions K1 and VK1 formed therein. The opening portions K1 may be arranged above the insulating layer M1', and the opening portions VK1 may be arranged above the filling film 21. The arrangement positions of the opening portions K1 and VK1 have a spatial periodicity in a horizontal plane defined by two axes in the row direction DR and the column direction DC. At this time, the diameters of the opening portions K1 and VK1 are equal to each other. Further, the distance L1 between adjacent ones of the opening portions K1 in the column direction DC is equal to the distance L2 between adjacent ones of the opening portions K1 and VK1 in the column direction DC.

The distance P1 between adjacent ones of the opening portions K1 in the row direction DR is equal to the distance P2 between adjacent ones of the opening portions VK1 in the row direction DR. The opening portions K1 and VK1 may be arrayed in a staggered arrangement. In this case, for example, the opening portions VK1 are arrayed in one row in the row direction DR, and the opening portions K1 are arrayed in four rows on either side of the opening portions VK1.

Figure 9A:
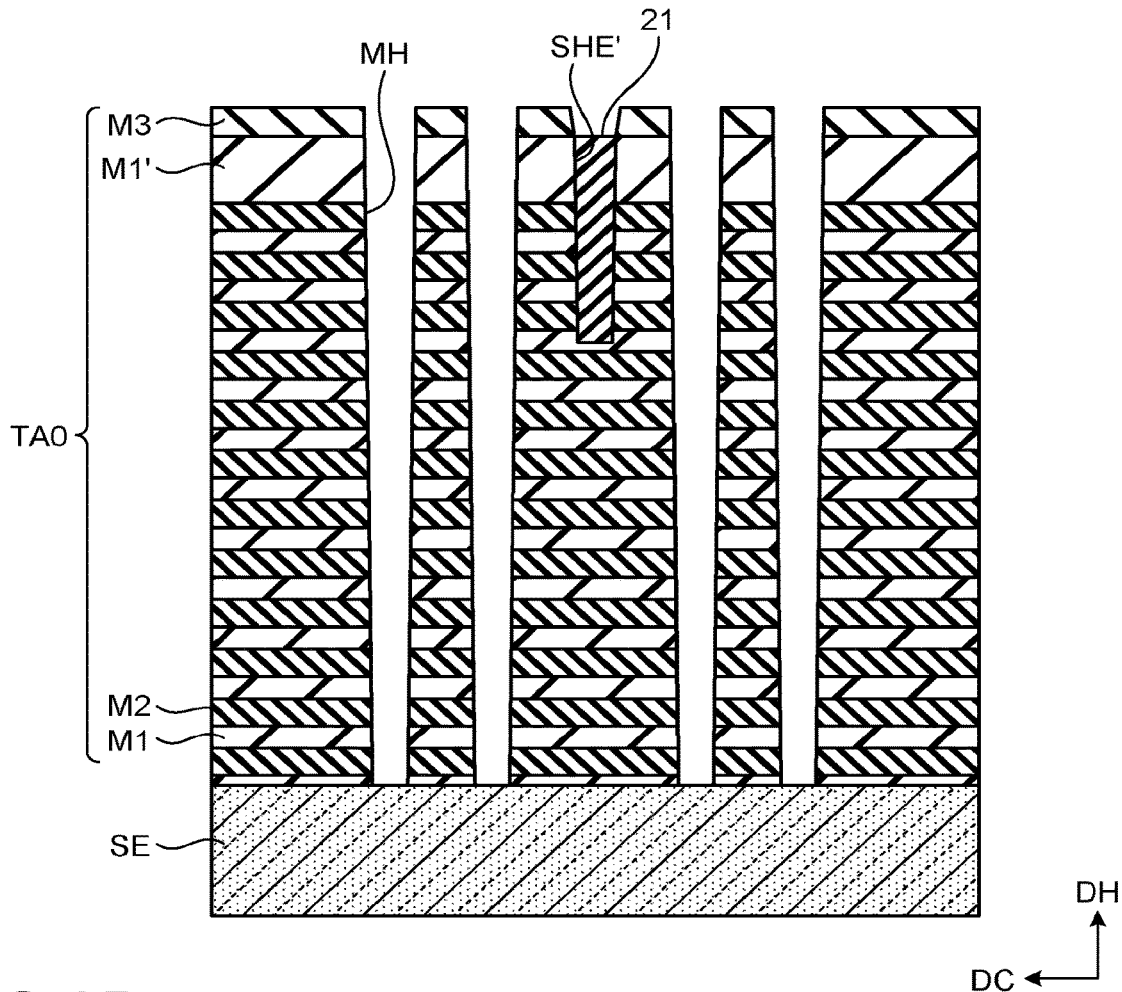
FIG. 9A is a sectional view showing the manufacturing method of a non-volatile semiconductor memory device according to the third embodiment.
Figure 9B:
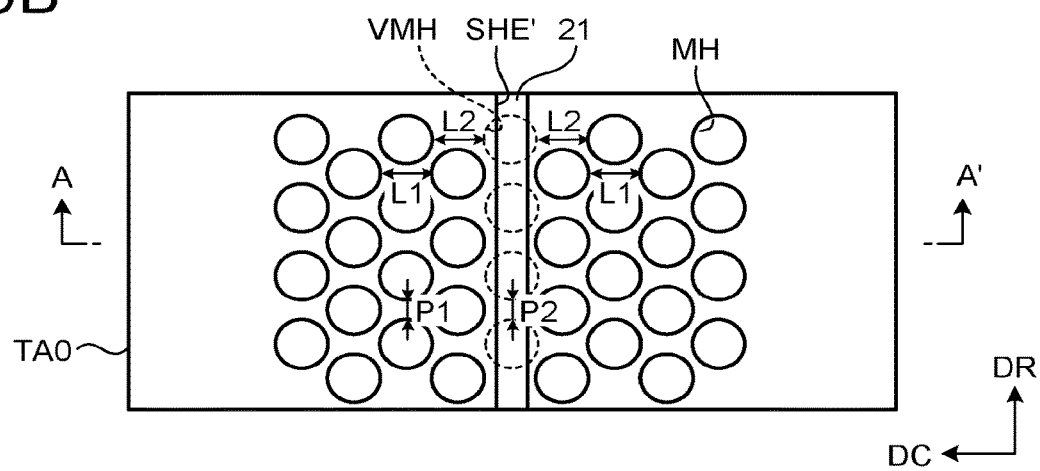
FIG. 9B is a plan view showing the manufacturing method of a non-volatile semiconductor memory device according to the third embodiment.

Then, as shown in FIGS. 9A and 9B, the insulating layers M1, M1', and M2 are etched, through the resist pattern R1 serving as a mask, so that memory holes MH are formed in the stacked body TA0. At this time, the etching is hindered at the positions of the opening portions VK1 by the filling film 21. Consequently, below the slit SHE', the memory holes MH are prevented from being formed in the stacked body TA0.

Here, since the arrangement positions of the opening portions K1 and VK1 have a periodicity because of the opening portions VK1 arranged above the filling film 21, the uniformity of the shape of the opening portions K1 is improved. Consequently, the uniformity of the shape of the memory holes MH is improved; by which the difference in writing characteristic and erasing characteristic between the memory cells MC and the difference in threshold between the memory cells MC can be reduced, and thereby the reliability of the memory cells MC can be improved.

Incidentally, on the premise that memory holes MH are hypothetically arranged as virtual holes VMH at the positions of the opening portions VK1, the arrangement positions of the virtual holes VMH and the memory holes MH have a spatial periodicity in a horizontal plane defined by two axes in the row direction DR and the column direction DC. In this case, the diameters of the memory holes MH and the virtual holes VMH are equal to each other. Further, the distance L1 between adjacent ones of the memory holes MH in the column direction DC is equal to the distance L2 between adjacent ones of the memory holes MH and virtual holes VMH in the column direction DC. The distance P1 between adjacent ones of the memory holes MH in the row direction DR is equal to the distance P2 between adjacent ones of the virtual holes VMH in the row direction DR. Here, the memory holes MH and the virtual holes VMH may be arrayed in a staggered arrangement.

Figure 10:
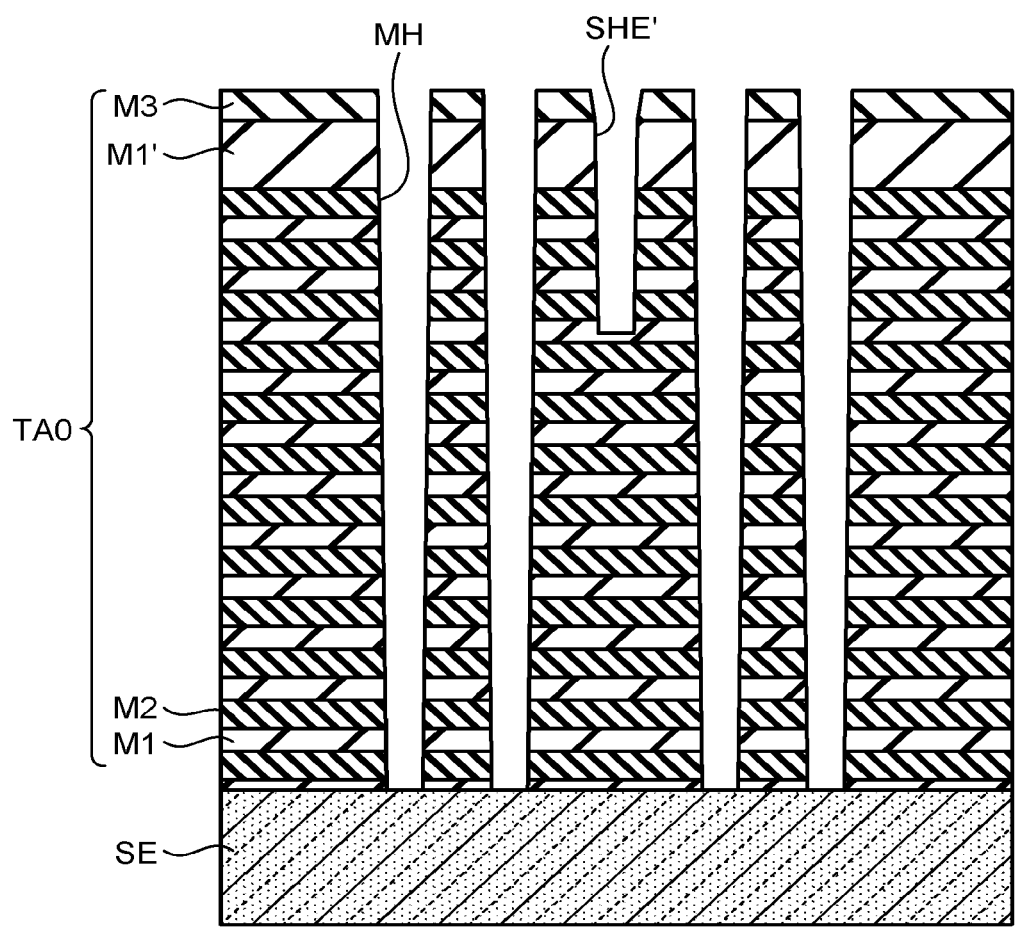
FIG. 10 is a sectional view showing the manufacturing method of a non-volatile semiconductor memory device according to the third embodiment.

Then, as shown in FIG. 10, the filling film 21 in the slit SHE' is removed by etching the filling film 21.

Figure 11:
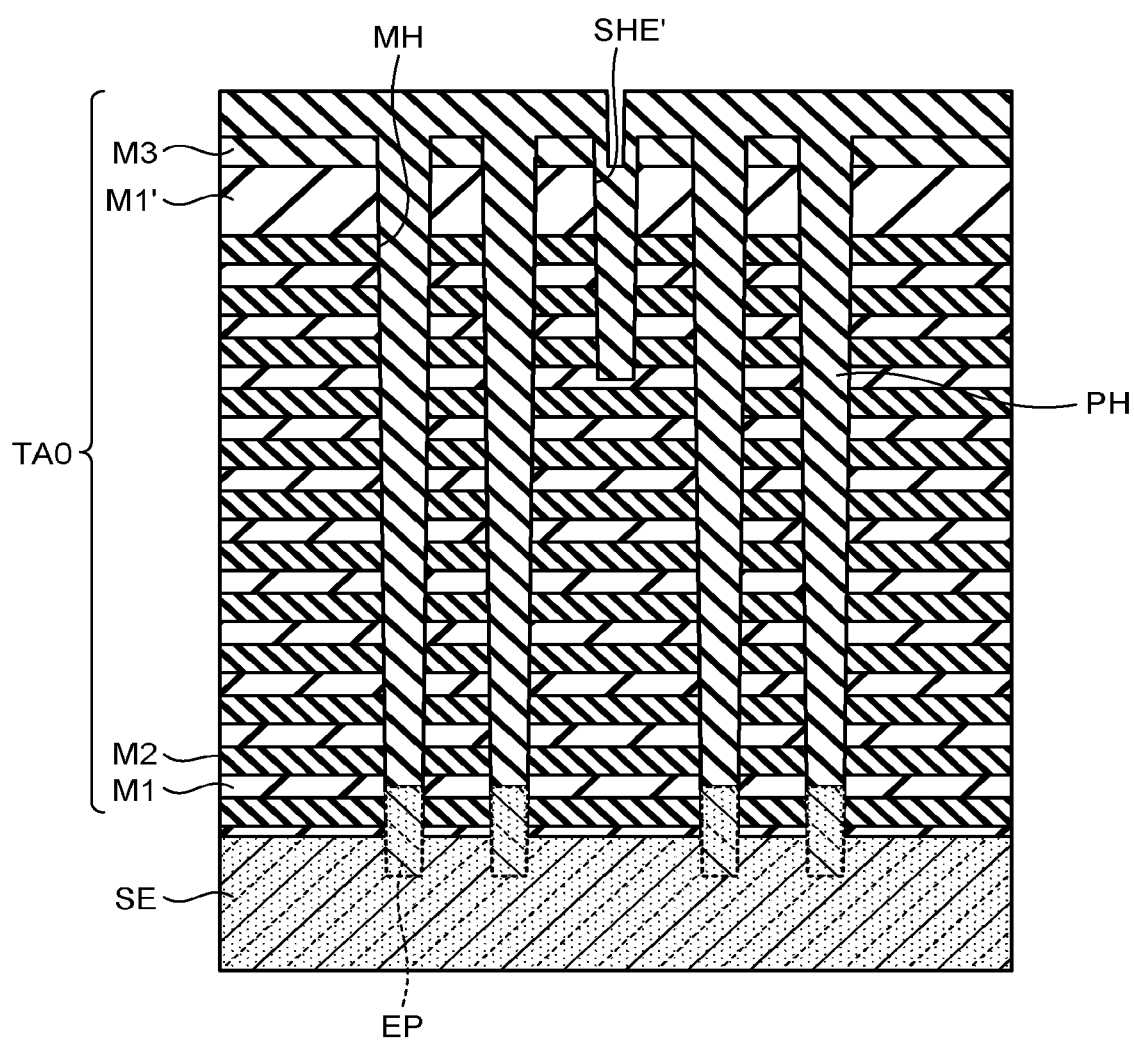
FIG. 11 is a sectional view showing the manufacturing method of a non-volatile semiconductor memory device according to the third embodiment.

Then, as shown in FIG. 11, columnar bodies PH are respectively formed in the memory holes MH by use of a CVD method or the like. Each of the columnar bodies PH may include a tunnel film, a channel film, a charge trap film, and a block film. For example, as the material of the channel film, Si may be used; as the material of the charge trap film, SiN may be used; and, as the material of the tunnel film and the block film, $SiO_2$ may be used.

Further, before the columnar bodies PH are respectively formed in the memory holes MH, a semiconductor layer EP may be formed at the bottom of the memory holes MH by use of an epitaxial growth method. As the material of the semiconductor layer EP, the same material as the semiconductor substrate SE may be used. Here, if the semiconductor layer EP is formed at the bottom of the memory holes MH, the cell current flowing through each of the memory cells MC can be increased.

Figure 12:
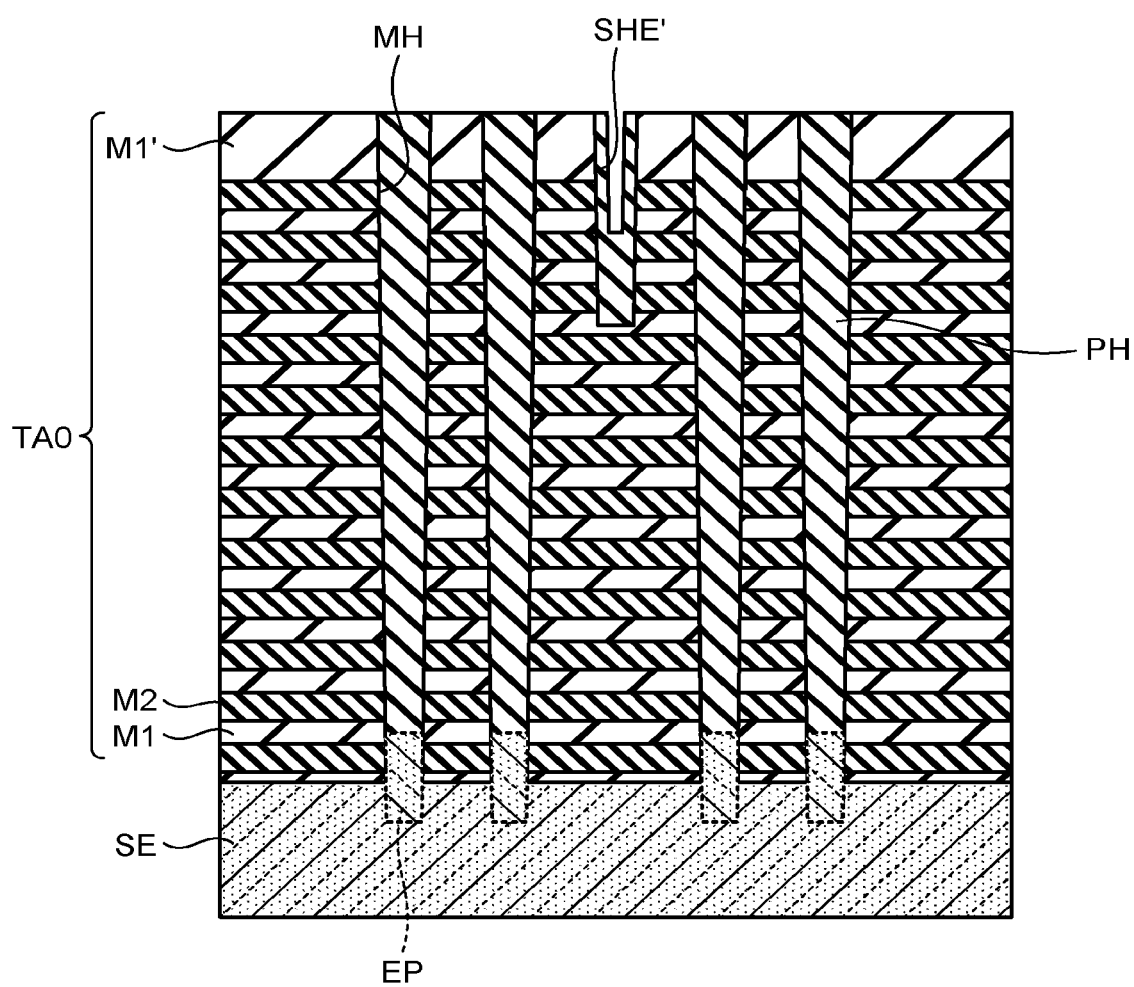
FIG. 12 is a sectional view showing the manufacturing method of a non-volatile semiconductor memory device according to the third embodiment.

Then, as shown in FIG. 12, the film thickness of the columnar bodies PH is reduced by use of a CMP or etching-back method, until the surface of the insulating layer M1' is exposed. At this time, the insulating layer M3 can be removed. Here, a columnar body PH may be left in the slit SHE'.

Figure 13A:
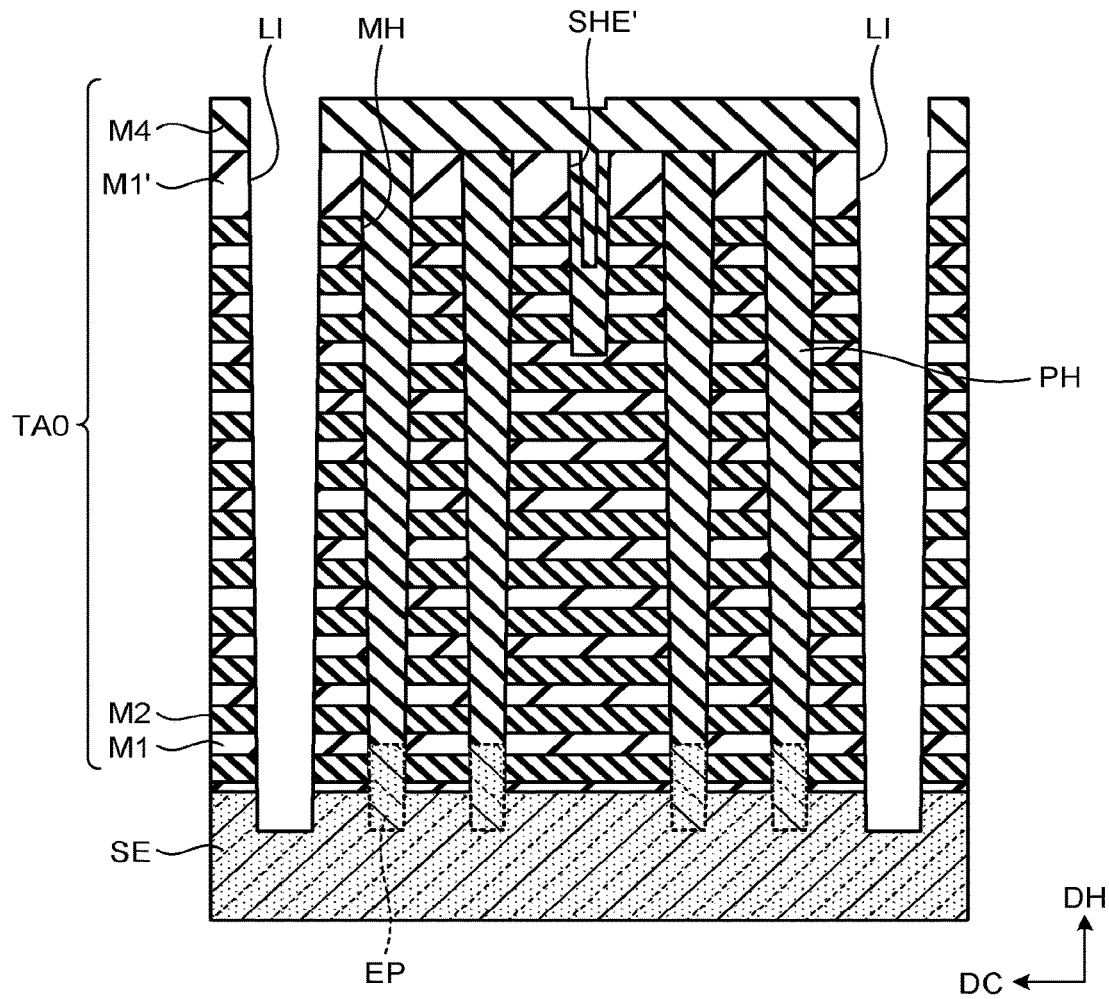
FIG. 13A is a sectional view showing the manufacturing method of a non-volatile semiconductor memory device according to the third embodiment.
Figure 13B:
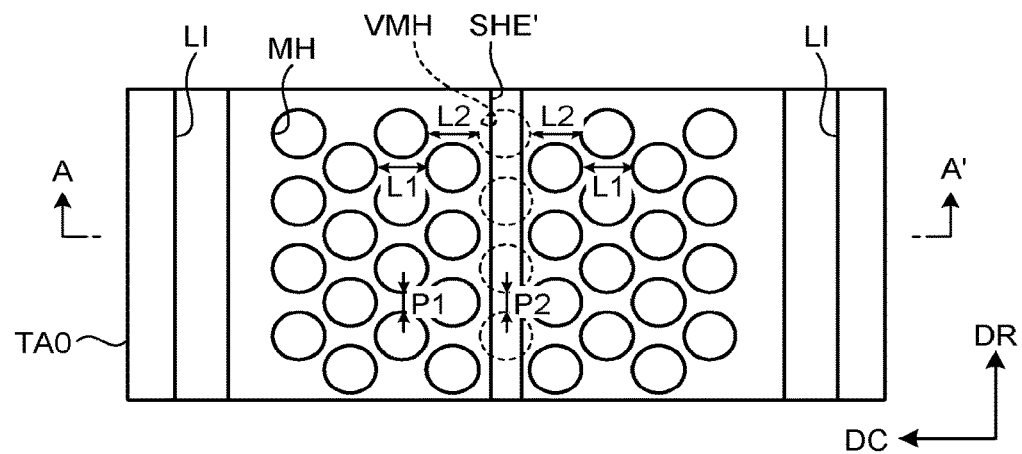
FIG. 13B is a plan view showing the manufacturing method of a non-volatile semiconductor memory device according to the third embodiment.

Then, as shown in FIGS. 13A and 13B, an interlayer insulating film M4 is formed on the insulating layer M1' and the columnar bodies PH by use of a CVD method or the like. As the material of the interlayer insulating film M4, for example, $SiO_2$ may be used. Here, if the interlayer insulating film M4 is formed while the columnar body PH remains in the slit SHE', the step of removing the columnar body PH is omitted, and thereby the number of steps can be reduced.

Then, slits LI are formed in the stacked body TA0 by use of a photolithography technique and a dry etching technique. Then, an etchant is made to infiltrate into the stacked body TA0 through the slits LI and selectively etch the insulating layers M2, and thereby the insulating layers M2 are removed. Then, conductive layers are respectively embedded into gap spaces formed by removing the insulating layers M2, so that the stacked body TA' shown in FIG. 6 is formed. As the material of the conductive layers, for example, a metal, such as W, may be used.

As described above, the memory holes MH are prevented from being formed in the stacked body TA0 below the slit SHE', and so the columnar bodies PH are also prevented from being formed below the slit SHE'. Consequently, below the slit SHE', the conductive layers can be uniformly embedded in the gap spaces formed by removing the insulating layers M2, and thereby the resistance of the word lines WL can be reduced.

Fourth Embodiment

Figure 14:
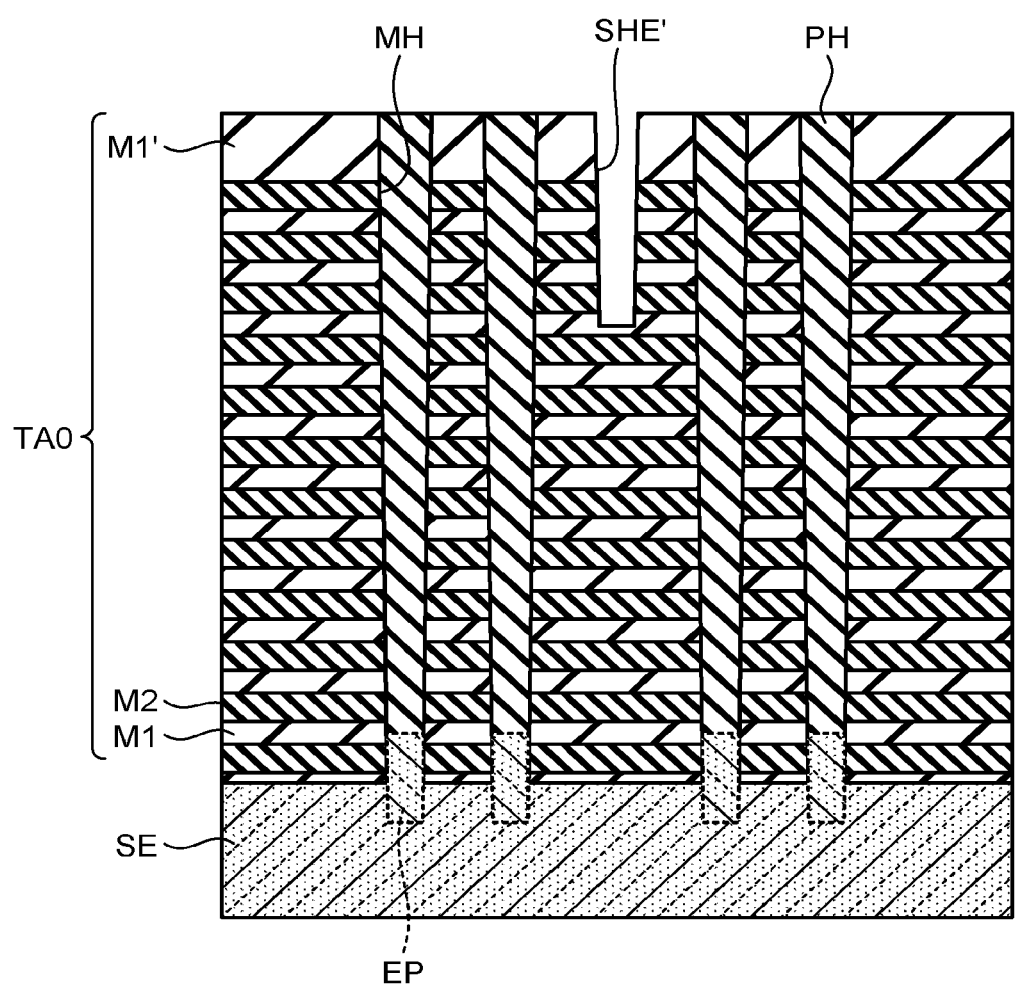
FIG. 14 is a sectional view showing a manufacturing method of a non-volatile semiconductor memory device according to a fourth embodiment.
Figure 15:
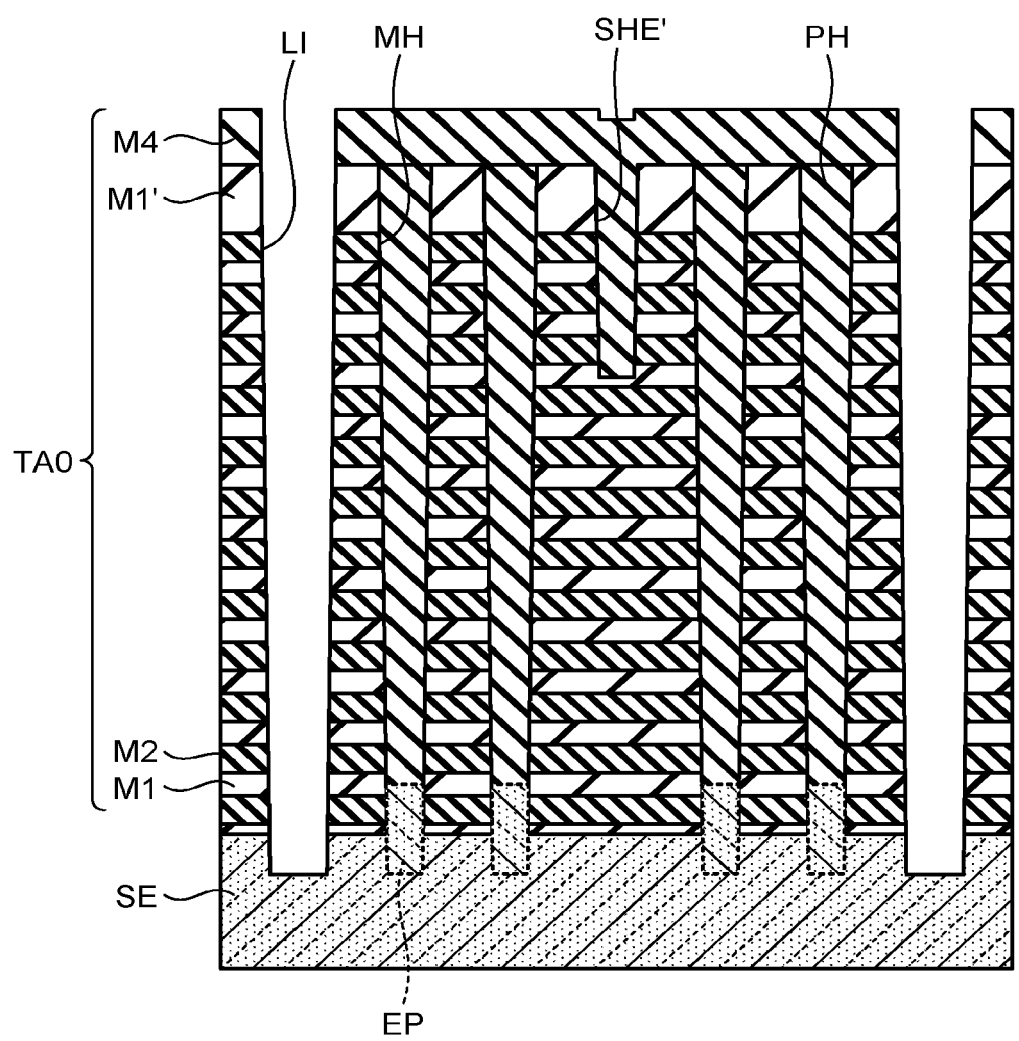
FIG. 15 is a sectional view showing the manufacturing method of a non-volatile semiconductor memory device according to the fourth embodiment.

FIGS. 14 and 15 are sectional views showing a manufacturing method of a non-volatile semiconductor memory device according to a fourth embodiment.

At first, steps the same as those shown in FIGS. 7A, 8A, 9A, and 10 to 12 are performed.

Then, as shown in FIG. 14, the columnar body PH in the slit SHE' is removed by use of a photolithography technique and a dry etching technique.

Then, as shown in FIG. 15, an interlayer insulating film M4 is formed on the insulating layer M1' and the columnar bodies PH by use of a CVD method or the like. At this time, part of the interlayer insulating film M4 comes to be embedded into the slit SHE'. As described above, the columnar body PH in the slit SHE' is removed, and then part of the interlayer insulating film M4 is embedded into the slit SHE'. As a result, the capacity between the word lines WL can be reduced, and thereby the writing speed of the memory cells MC can be increased.

Fifth Embodiment

Figure 16:
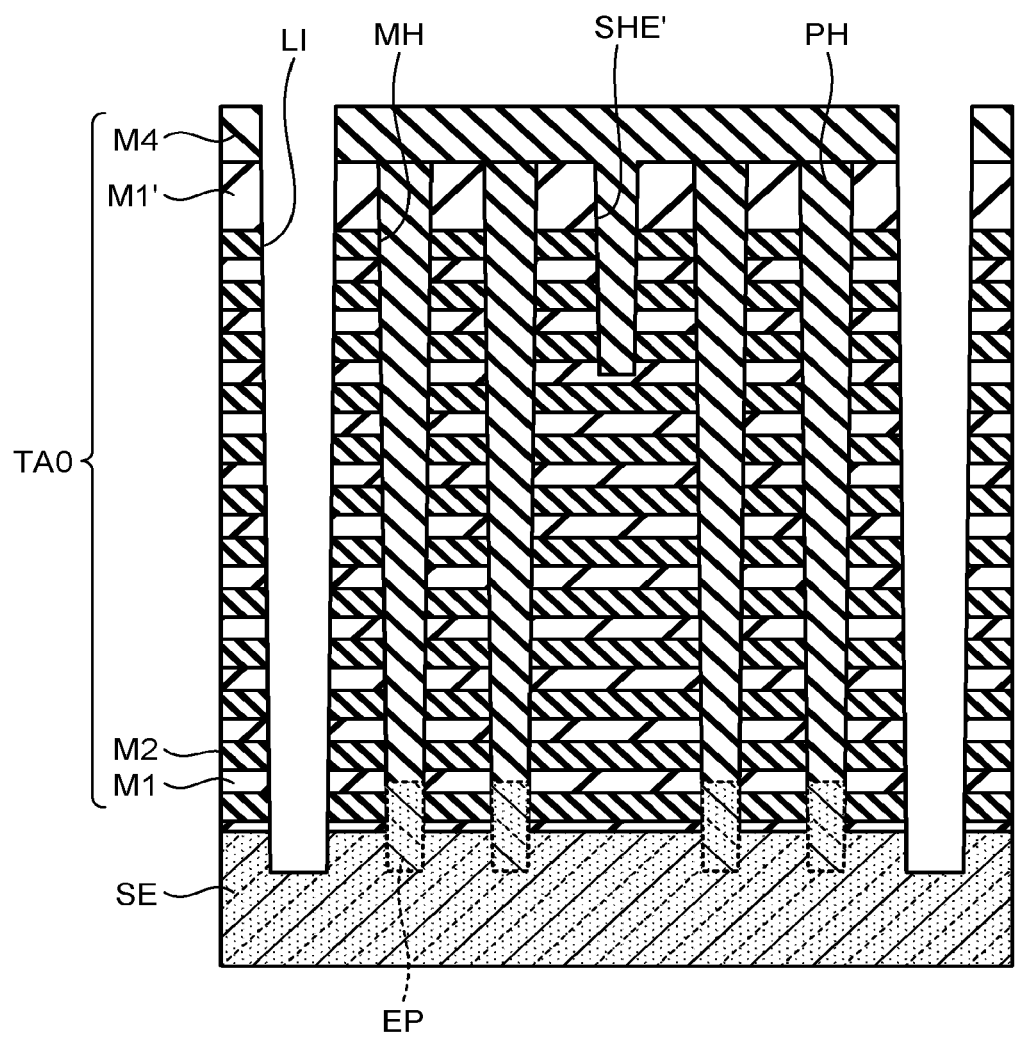
FIG. 16 is a sectional view showing a manufacturing method of a non-volatile semiconductor memory device according to a fifth embodiment.

FIG. 16 is a sectional view showing a manufacturing method of a non-volatile semiconductor memory device according to a fifth embodiment.

As shown in FIG. 16, after the interlayer insulating film M4 is formed on the insulating layer M1' and the columnar bodies PH in the step shown in FIG. 15, the interlayer insulating film M4 is planarized by use of a CMP method or the like. Here, since the interlayer insulating film M4 is planarized, it is possible to improve the uniformity of photolithography and processing in forming contacts to be connected to the columnar bodies PH.

Sixth Embodiment

Figure 17A:
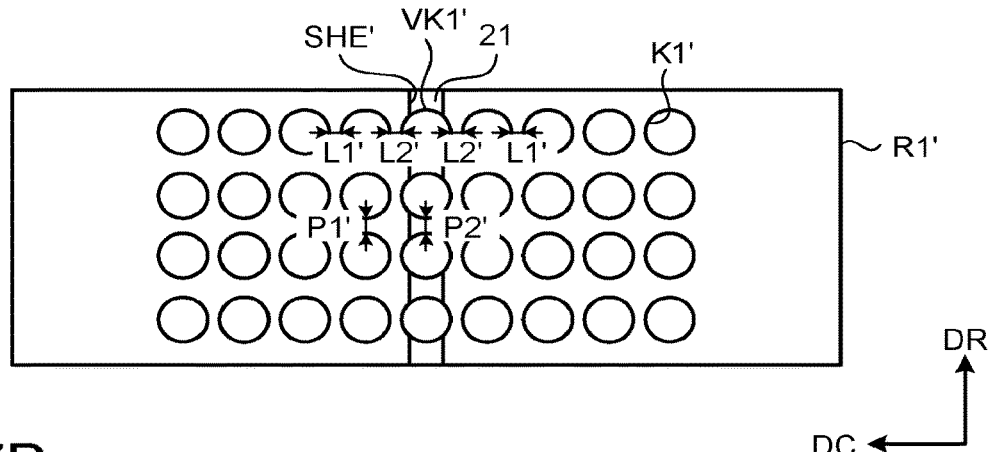
FIGS. 17A to 17C are plan views showing a manufacturing method of a non-volatile semiconductor memory device according to a sixth embodiment.
Figure 17B:
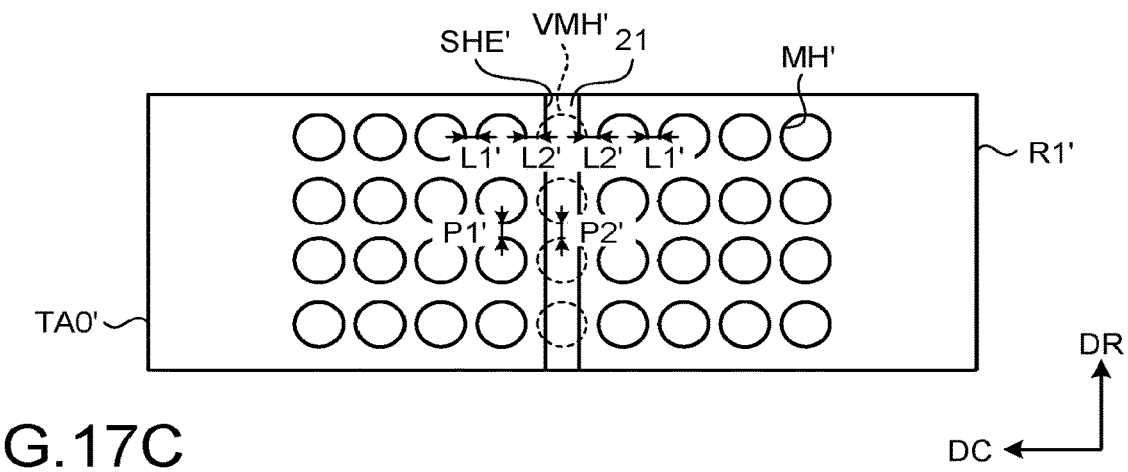
Figure 17C:
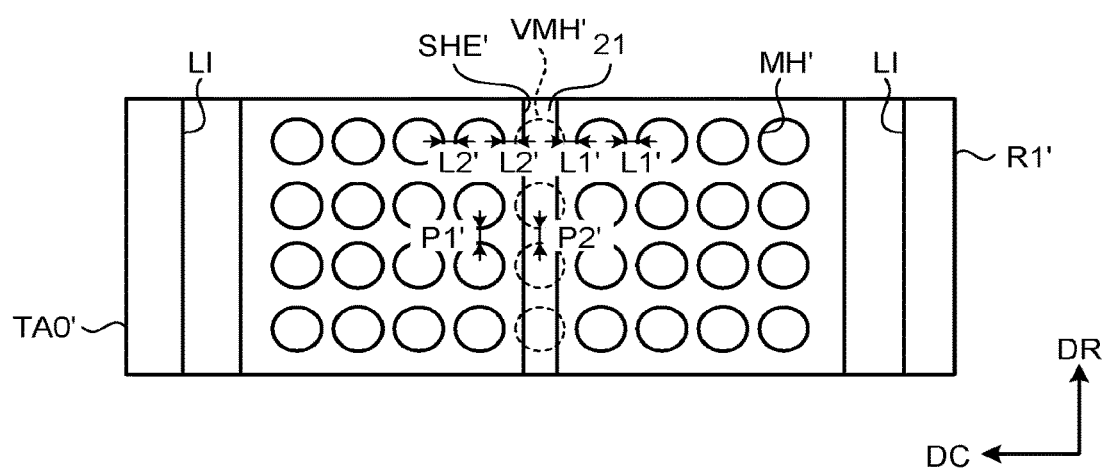

FIGS. 17A to 17C are plan views showing a manufacturing method of a non-volatile semiconductor memory device according to a sixth embodiment. Here, the steps shown in FIGS. 17A to 17C correspond to the steps shown in FIGS. 8B, 9B, and 13B.

As shown in FIG. 17A, a resist pattern R1' is used in place of the resist pattern R1 shown in FIG. 8B. The resist pattern R1' includes opening portions K1' and VK1' formed therein. The opening portions K1' may be arranged above the insulating layer M1', and the opening portions VK1' may be arranged above the filling film 21.

The arrangement positions of the opening portions K1' and VK1' have a spatial periodicity in a horizontal plane defined by two axes in the row direction DR and the column direction DC. At this time, the diameters of the opening portions K1' and VK1' are equal to each other. Further, the distance L1' between adjacent ones of the opening portions K1' in the column direction DC is equal to the distance L2' between adjacent ones of the opening portions K1' and VK1' in the column direction DC. The distance P1' between adjacent ones of the opening portions K1' in the row direction DR is equal to the distance P2' between adjacent ones of the opening portions VK1' in the row direction DR. The opening portions K1' and VK1' may be arrayed in a square arrangement. In this case, for example, the opening portions VK1' are arrayed in one row in the row direction DR, and the opening portions K1' are arrayed in four rows on either side of the opening portions VK1'.

Then, as shown in FIG. 17B, the insulating layers M1, M1', and M2 are etched, through the resist pattern R1' serving as a mask, and thereby memory holes MH' are formed in a stacked body TA0'. At this time, the etching is hindered at the positions of the opening portions VK1' by the filling film 21. Consequently, below the slit SHE', the memory holes MH' are prevented from being formed in the stacked body TA0'.

Here, since the arrangement positions of the opening portions K1' and VK1' have a periodicity because of the opening portions VK1' arranged above the filling film 21, the uniformity of the shape of the opening portions K1' is improved. Consequently, the uniformity of the shape of the memory holes MH' is improved; by which the difference in writing characteristic and erasing characteristic between the memory cells MC and the difference in threshold between the memory cells MC can be reduced, and thereby the reliability of the memory cells MC can be improved.

Incidentally, on the premise that memory holes MH' are hypothetically arranged as virtual holes VMH' at the positions of the opening portions VK1', the arrangement positions of the virtual holes VMH' and the memory holes MH' have a spatial periodicity in a horizontal plane defined by two axes in the row direction DR and the column direction DC. In this case, the diameters of the memory holes MH' and the virtual holes VMH' are equal to each other. Further, the distance L1' between adjacent ones of the memory holes MH' in the column direction DC is equal to the distance L2' between adjacent ones of the memory holes MH' and virtual holes VMH' in the column direction DC. The distance P1' between adjacent ones of the memory holes MH' in the row direction DR is equal to the distance P2' between adjacent ones of the virtual holes VMH' in the row direction DR. Here, the memory holes MH' and the virtual holes VMH' may be arrayed in a square arrangement. Thereafter, as shown in FIG. 17C, slits LI are formed in the stacked body TA0'.

Seventh Embodiment

FIGS. 18A to 18E are sectional views showing a manufacturing method of a non-volatile semiconductor memory device according to a seventh embodiment.

As shown in FIG. 18A, a stacked body TA1 is formed, in place of the stacked body TA0 shown in FIG. 8A, on a semiconductor substrate SE. The stacked body TA1 includes a slit SHE' formed therein.

Then, an insulating film 31 is deposited on the stacked body TA1 by use of a CVD method or the like, such that part of the insulating film 31 is embedded into the slit SHE'. At this time, a recess 31B is formed on the surface of the insulating film 31, as corresponding to the slit SHE'. As the material of the insulating film 31, for example, $SiO_2$ may be used. The insulating film 31 may be formed by use of TEOS (Tetra Ethyl Ortho Silicate). In this case, the width of the slit SHE' may be set to, for example, 100 nm, and the depth of the slit SHE' may be set to, for example, 300 nm.

Then, as shown in FIG. 18B, the insulating film 31 is etched back, until the insulating layer M1' is exposed. At this time, a recess 31K is formed in the surface of the insulating film 31, as corresponding to the recess 31B.

Then, an APF (Advanced Patterning Film) 32 is formed on the insulating layer M1' and the insulating film 31 by use of a CVD method or the like. The APF 32 may be made of a material having an etching rate lower than those of the insulating layers M1, M1', and M2. For example, as the APF 32, a carbon film may be used. At this time, a recess 32K is formed in the surface of the APF 32, as corresponding to the recess 31K of the insulating film 31.

Then, a DARC (Dielectric Anti-Reflective Coating) film 33 is formed on the APF 32 by use of a CVD method or the like. As the DARC film 33, for example, an SiON film may be used. At this time, a recess 33K is formed in the surface of the DARC film 33, as corresponding to the recess 32K of the APF 32.

Then, a BARC (Bottom Anti-Reflective Coating) film 34 is formed on the DARC film 33 by use of a coating method or the like. The BARC film 34 may be made of a material having an etching rate lower than that of the APF 32. For example, as the BARC film 34, a carbon film may be used. At this time, since the BARC film 34 is formed by coating, the surface of the BARC film 34 can be made flat. Consequently, a film thickness T2 of the BARC film 34 above the insulating film 31 can be set larger than a film thickness T1 of the BARC film 34 above the insulating film M1'.

Then, a resist pattern R1 is formed on the BARC film 34 by use of a photolithography technique. The resist pattern R1 includes opening portions K1 and VK1 formed therein. The opening portions K1 may be arranged above the insulating layer M1', and the opening portions VK1 may be arranged above the filling film 31. The resist pattern R1 may be configured in the same way as that shown in FIGS. 8A and 8B.

Then, as shown in FIG. 18C, the BARC film 34, the DARC film 33, and the APF 32 are sequentially etched, through the resist pattern R1 serving as a mask, so that opening portions 34A and 34B are formed in the BARC film 34, opening portions 33A and 33B are formed in the DARC film 33, and opening portions 32A and 32B are formed in the APF 32. The opening portions 34A to 32A are arranged above the insulating layer M1', and the opening portions 34B to 32B are arranged above the insulating layer 31. At this time, the film thickness T2 of the BARC film 34 above the insulating film 31 is larger than the film thickness T1 of the BARC film 34 above the insulating film M1', and the BARC film 34 has an etching rate lower than that of the APF 32. Consequently, in the APF 32, the depth of the opening portions 32B can become smaller than the depth of the opening portions 32A. At this time, the conditions may be set such that the opening portions 32A penetrate the APF 32 and the opening portions 32B do not penetrate the APF 32.

Then, as shown in FIG. 18D, the insulating layers M1, M1', and M2 are etched, through the BARC film 34, the DARC film 33, and the APF 32, so that memory holes MH are formed in the stacked body TA1. At this time, there may be used etching conditions with which the opening portions 32B do not complete penetration. Consequently, below the slit SHE', the memory holes MH are prevented from being formed in the stacked body TA1.

Here, since the arrangement positions of the opening portions K1 and VK1 have a periodicity because of the opening portions VK1 arranged above the filling film 31, the uniformity of the shape of the opening portions K1 is improved. Consequently, the uniformity of the shape of the memory holes MH is improved; by which the difference in writing characteristic and erasing characteristic between the memory cells MC and the difference in threshold between the memory cells MC can be reduced, and thereby the reliability of the memory cells MC can be improved.

Then, as shown in FIG. 18E, columnar bodies PH are respectively formed in the memory holes MH. At this time, part of a columnar body PH is left in the recess 31K. For example, the part of the columnar body PH left in the recess 31K is formed of a tunnel film, channel film, charge trap film, or block film. Then, an interlayer insulating film M4 is formed on the insulating layer M1' and the columnar bodies PH by use of a CVD method or the like.

As described above, the memory holes MH are prevented from being formed in the stacked body TA1 below the slit SHE', and so the columnar bodies PH are also prevented from being formed below the slit SHE'. Consequently, below the slit SHE', the conductive layers can be uniformly embedded in the gap spaces formed by removing the insulating layers M2, and thereby the resistance of the word lines WL can be reduced.

Eighth Embodiment

Figure 19:
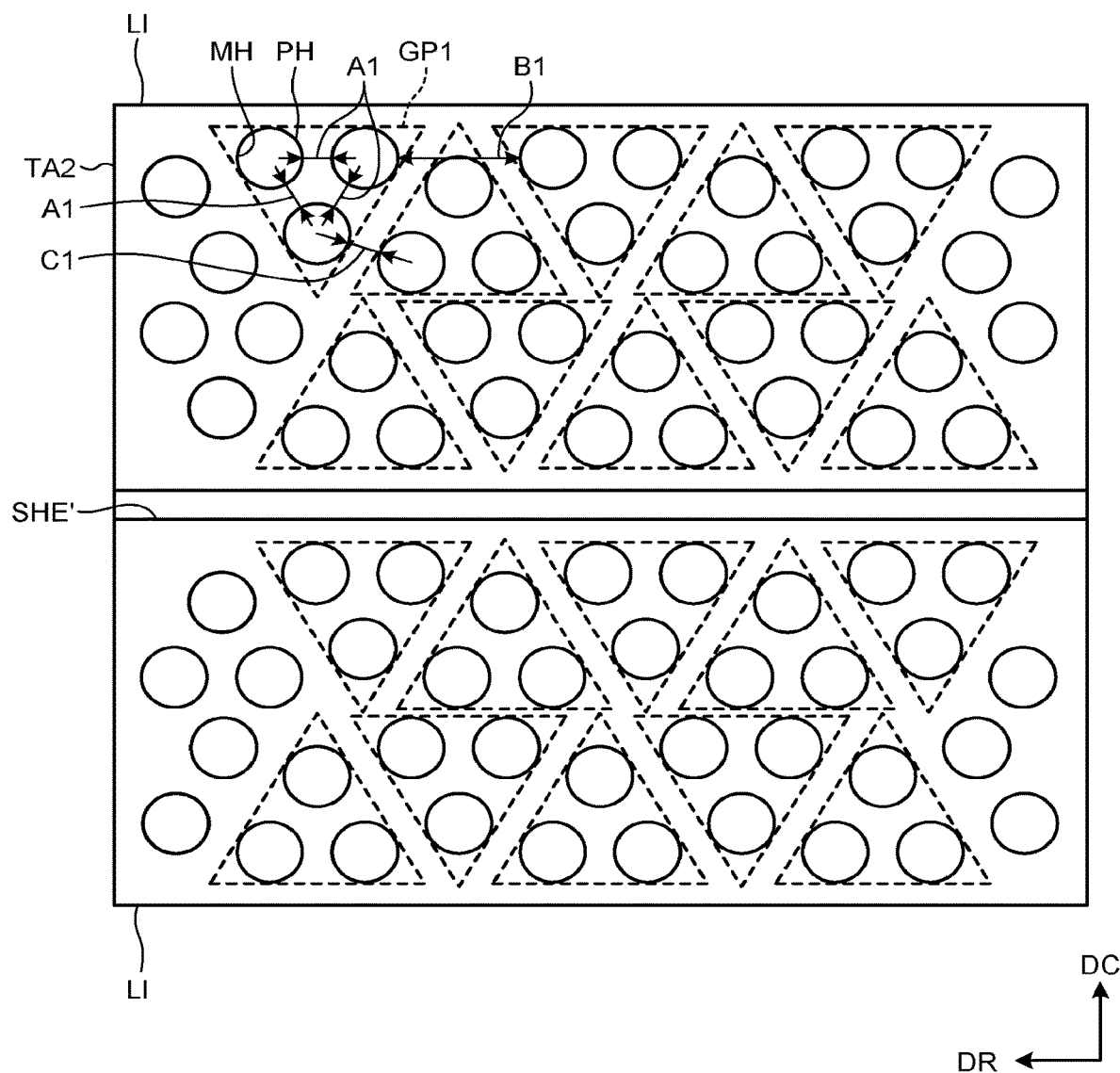
FIG. 19 is a plan view showing an arrangement example of memory holes of a non-volatile semiconductor memory device according to an eighth embodiment.

FIG. 19 is a plan view showing an arrangement example of memory holes of a non-volatile semiconductor memory device according to an eighth embodiment.

As shown in FIG. 19, a stacked body TA2 is disposed, in place of the stacked body TA1 shown in FIG. 18E, on a semiconductor substrate SE. In the stacked body TA2, a slit SHE' is formed. Slits LI are respectively formed on both sides of the slit SHE'. Further, in the stacked body TA2, memory holes MH are formed, and columnar bodies PH are respectively disposed in the memory holes MH. Here, the memory holes MH are arranged in the stacked body TA2 such that the distances between the memory holes MH are different in the row direction DR. For example, in the row closest to each of the slits LI, memory holes MH may be arranged in the row direction DR such that distances A1 and B1 (A1<B1) are alternately set between the memory holes MH in the row direction DR.

In this case, three memory holes MH arranged at the apex positions of a triangle defined by the distance A1 may form one group GP1. Between groups GP1 adjacent to each other, the distance C1 between their memory holes MH may be set larger than the distance A1. Here, groups GP1 adjacent to each other in the row direction DR may be arranged as being shifted to be separated from each other in the column direction DC.

FIGS. 20A to 20C and 21A to 21C are sectional views showing a manufacturing method of a non-volatile semiconductor memory device according to the eighth embodiment. FIG. 22 is a plan view showing entering routes of conductive bodies in the step shown in FIG. 21B in association with arrangement of the memory holes shown in FIG. 19.

Figure 20A:
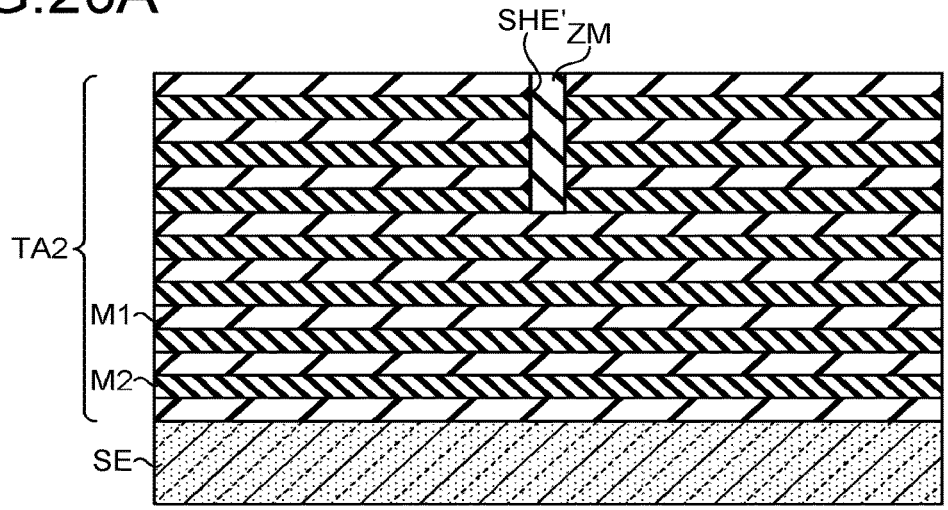
FIGS. 20A to 20C are sectional views showing a manufacturing method of a non-volatile semiconductor memory device according to the eighth embodiment.

As shown in FIG. 20A, insulating layers M1 and M2 are alternately stacked on a semiconductor substrate SE by use of a CVD method or the like. The insulating layers M1 and M2 may compose a stacked body TA2.

Then, a slit SHE' is formed in the stacked body TA2 by use of a photolithography technique and a dry etching technique. At this time, the etching of the stacked body TA2 may be stopped when the slit SHE' penetrates the third layer of the insulating layers M2 from the top.

Then, a filling film ZM is formed in the slit SHE' by use of a CVD method or the like. As the material of the insulating film ZM, for example, $SiO_2$ may be used. The insulating film ZM may be formed by use of TEOS (Tetra Ethyl Ortho Silicate).

Figure 20B:
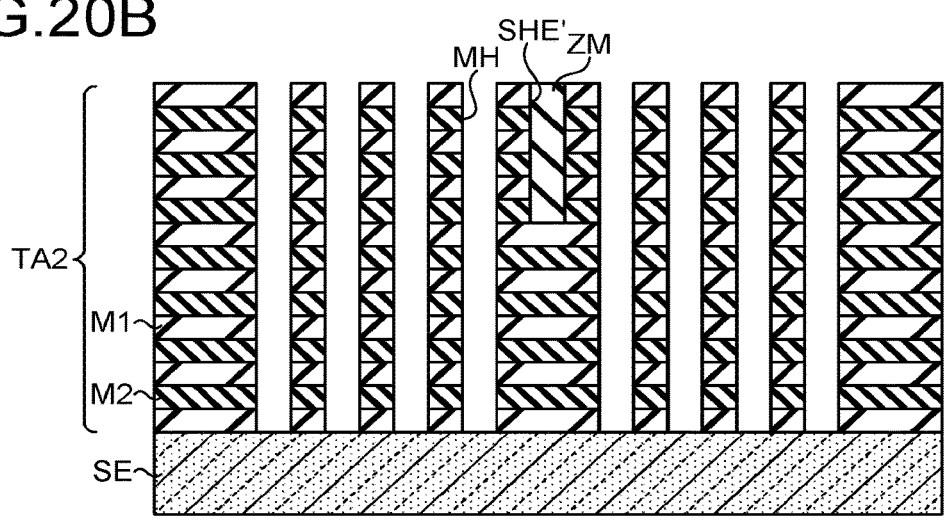

Then, as shown in FIG. 20B, memory holes MH are formed in the stacked body TA2 by use of a photolithography technique and a dry etching technique. At this time, below the slit SHE', the memory holes MH are prevented from being formed in the stacked body TA2. In order to prevent the memory holes MH from being formed in the stacked body TA2 below the slit SHE', a resist pattern serving as a mask in forming the memory holes MH may be prepared to exclude some of the opening portions formed as corresponding to the memory holes MH.

Figure 20C:
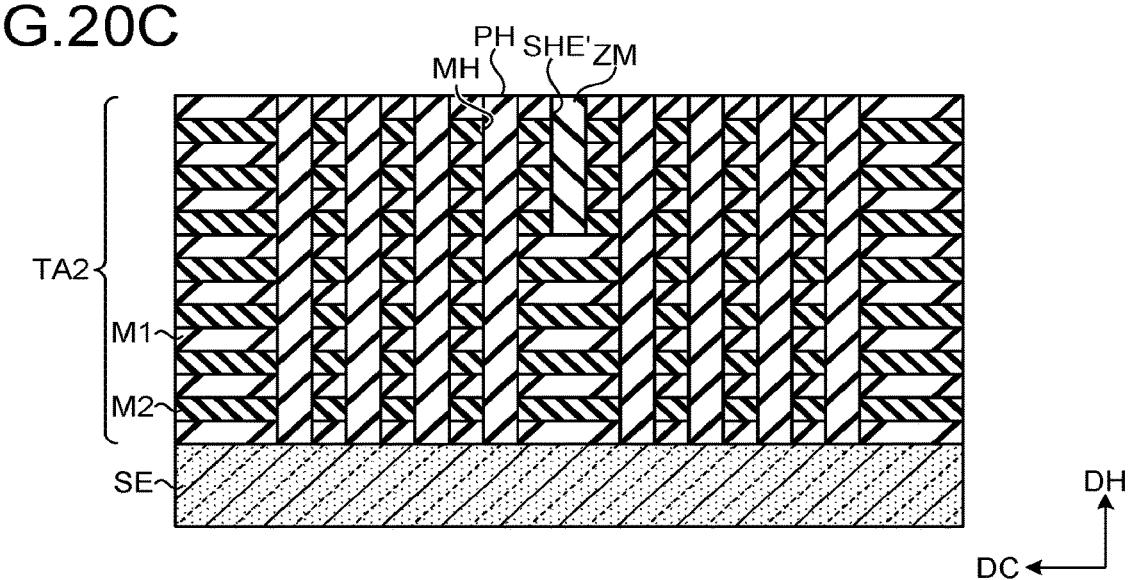

Then, as shown in FIG. 20C, columnar bodies PH are respectively formed in the memory holes MH by use of a CVD method or the like. Each of the columnar bodies PH may include a tunnel film, a channel film, a charge trap film, and a block film.

Figure 21A:
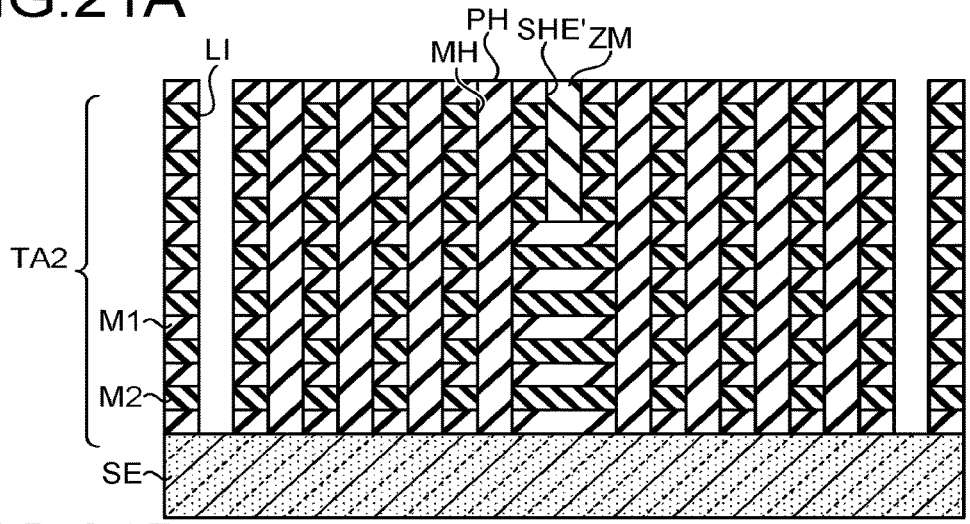
FIGS. 21A to 21C are sectional views showing the manufacturing method of a non-volatile semiconductor memory device according to the eighth embodiment.

Then, as shown in FIG. 21A, slits LI are formed in the stacked body TA2 by use of a photolithography technique and a dry etching technique. The slits LI may penetrate the stacked body TA2 in a stacking direction DH.

Figure 21B:
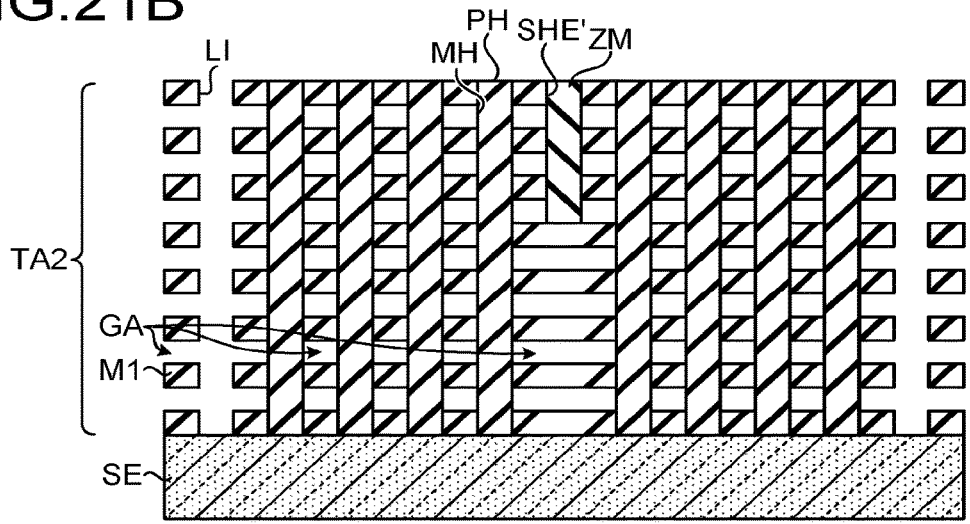

Then, as shown in FIG. 21B, an etchant is made to infiltrate into the stacked body TA2 through the slits LI and selectively etch the insulating layers M2. At this time, the insulating layers M2 are removed, so that gap spaces GA are formed between the insulating layers M1.

Figure 21C:
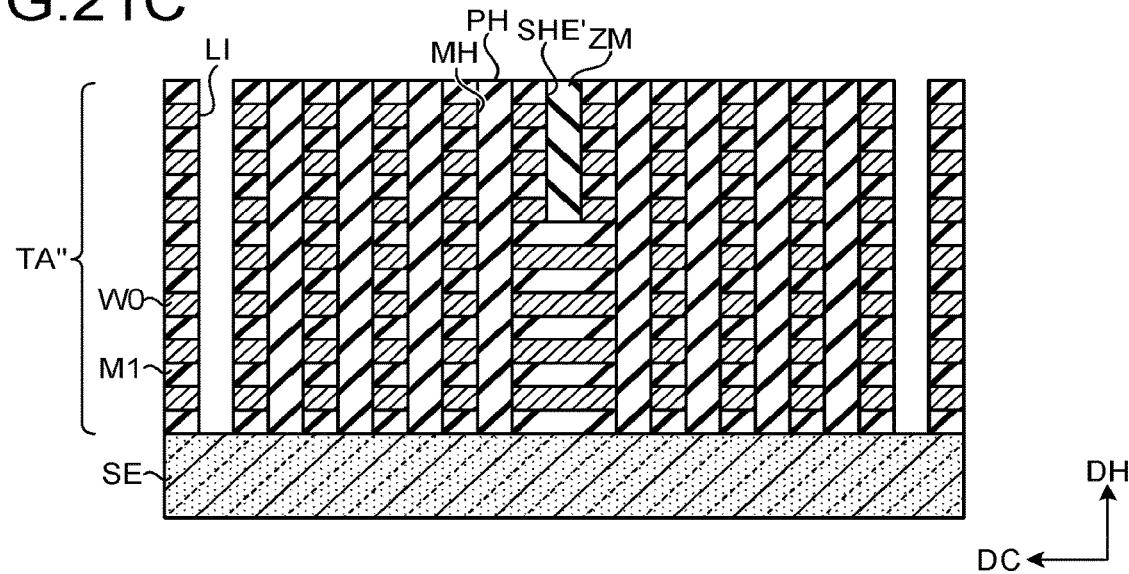

Then, as shown in FIG. 21C, a film formation gas is made to flow into the gap spaces GA through the slits LI and to form conductive layers W0 embedded in the gap spaces GA, and thereby a stacked body TA" is formed. As the material of the conductive layers W0, for example, a metal, such as W, may be used.

At this time, the columnar bodies PH act to hinder the film formation gas from flowing into the gap spaces GA. In light of this, the memory holes MH are prevented from being formed in the stacked body TA2 below the slit SHE', and so the columnar bodies PH are also prevented from being formed below the slit SHE'. Consequently, below the slit SHE', the conductive layers W0 can be uniformly embedded in the gap spaces GA, and thereby the resistance of the word lines WL can be reduced.

Further, as shown in FIG. 19, between the groups GP1 adjacent to each other, the distance C1 between their memory holes MH is set larger than the distance A1. In this case, as shown in FIG. 22, the film formation gas for the conductive layers W0 is given wider passages PAST between each of the slits LI and the gap spaces GA below the slit SHE', and so the film formation gas can be made to easily flow into the deep side of the gap spaces GA. Consequently, void generation in the conductive layers W0 is suppressed on the deep side of the gap spaces GA, and thereby the resistance of the word lines WL can be reduced.

Ninth Embodiment

FIG. 23 is a plan view showing an arrangement example of memory holes of a non-volatile semiconductor memory device according to a ninth embodiment.

As shown in FIG. 23, a stacked body TA2 is disposed on a semiconductor substrate SE. In the stacked body TA2, a slit SHE' is formed. Slits LI are respectively formed on both sides of the slit SHE'. Further, in the stacked body TA2, memory holes MH are formed, and columnar bodies PH are respectively disposed in the memory holes MH. Here, the memory holes MH are arranged in the stacked body TA2 such that the distances between the memory holes MH are different in the row direction DR. For example, in the row closest to each of the slits LI, memory holes MH may be arranged in the row direction DR such that distances A2 and B2 (A2<B2) are alternately set between the memory holes MH in the row direction DR.

In this case, three memory holes MH arranged at the apex positions of a triangle defined by the distance A2 may form one group GP2. Between groups GP2 adjacent to each other, the distance C2 between their memory holes MH may be set larger than the distance A2. Here, groups GP2 adjacent to each other in the row direction DR may be arranged as being shifted to be separated from each other in the column direction DC. Further, in each of the groups GP2, the three memory holes MH may be arranged as being shifted in a direction toward the center of the triangle.

FIG. 24 is a plan view showing entering routes of conductive bodies in the step shown in FIG. 21B in association with arrangement of the memory holes shown in FIG. 23.

As shown in FIG. 23, between the groups GP2 adjacent to each other, the distance C2 between their memory holes MH is set larger than the distance A2. Further, in each of the groups GP2, the three memory holes MH are arranged as being shifted in a direction toward the center of the triangle. In this case, as shown in FIG. 24, the film formation gas for the conductive layers W0 is given further wider passages PAS2 between each of the slits LI and the gap spaces GA below the slit SHE', and so the film formation gas can be made to easily flow into the deep side of the gap spaces GA. Consequently, void generation in the conductive layers W0 is suppressed on the deep side of the gap spaces GA, and thereby the resistance of the word lines WL can be reduced.

Figure 25A:
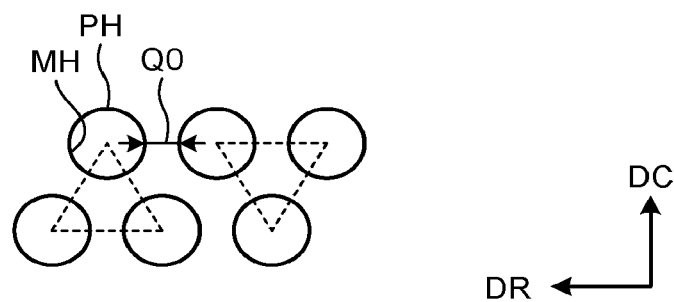
FIGS. 25A to 25C are plan views showing an arranging method of the memory holes of a non-volatile semiconductor memory device according to the ninth embodiment.
Figure 25B:
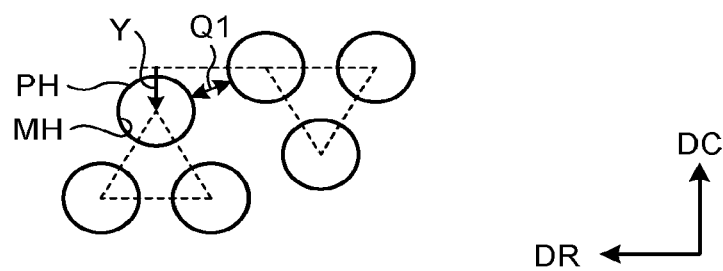
Figure 25C:
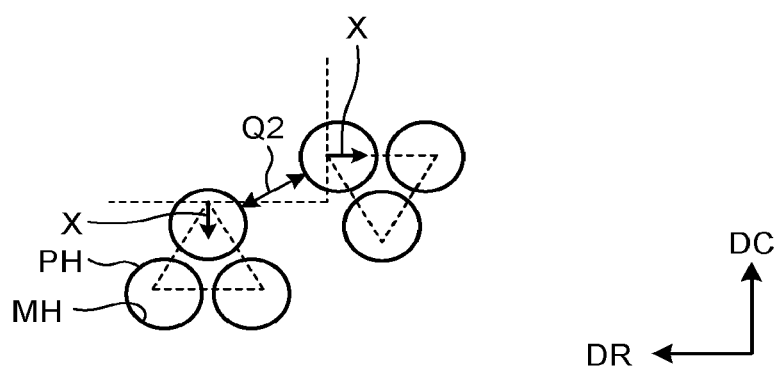

FIGS. 25A to 25C are plan views showing an arranging method of the memory holes of a non-volatile semiconductor memory device according to the ninth embodiment.

As shown in FIG. 25A, it is assumed that, before each group including three memory holes MH is shifted in the row direction DR, the inter-group distance between memory holes MH is Q0. Then, as shown in FIG. 25B, groups adjacent to each other in the row direction DR are arranged as being shifted to be separated from each other by a shift amount Y in the column direction DC, so that the inter-group distance between memory holes MH is set to Q1 (Q0<Q1). Further, as shown in FIG. 25C, in each group, the three memory holes MH are arranged as being shifted by a shift amount X in a direction toward the center of the triangle, so that the inter-group distance between memory holes MH is set to Q2 (Q1<Q2).

Figure 26:
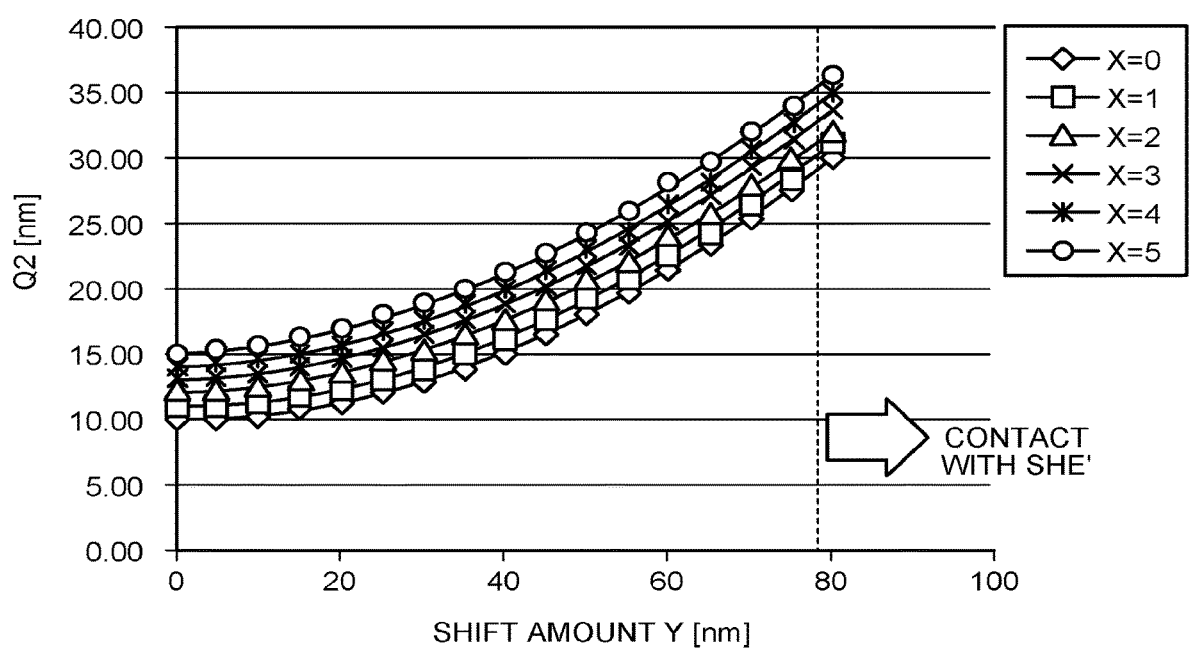
FIG. 26 is a view showing the relationship between a shift amount Y and a distance Q2, for when the shift amount X, which is shown in FIG. 25C, is changed.

FIG. 26 is a view showing the relationship between the shift amount Y and the distance Q2, for when the shift amount X, which is shown in FIG. 25C, is changed.

As shown in FIG. 26, with an increase in the shift amount Y, the distance Q2 becomes larger. However, if the shift amount Y is increased too much, some of the memory holes MH come into contact with the slit SHE'. Accordingly, the shift amount Y is set within a range in which none of the memory holes MH come into contact with the slit SHE'. Further, with an increase in the shift amount X, the distance Q2 becomes larger.

10th Embodiment

Figure 27:
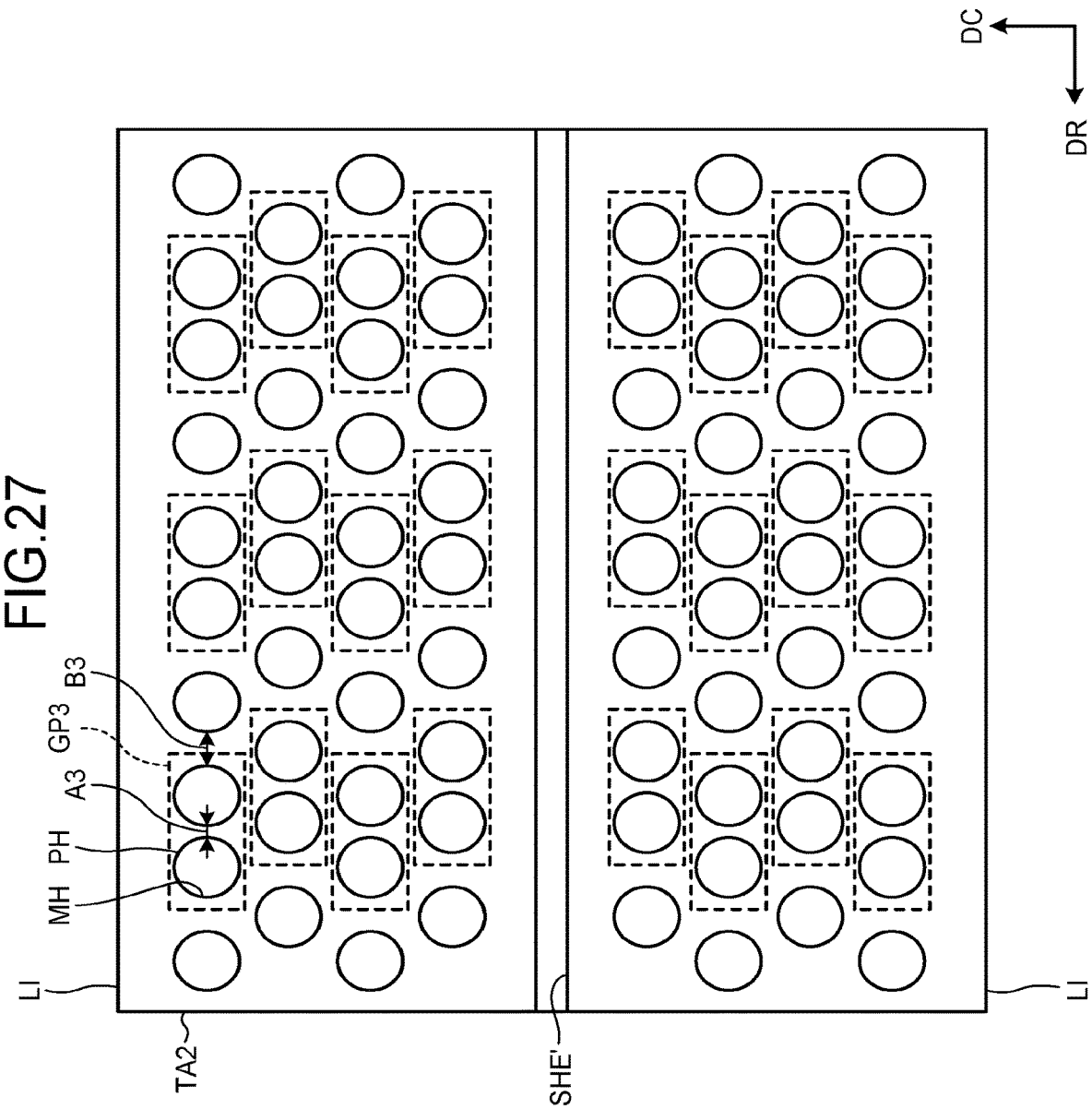
FIG. 27 is a plan view showing an arrangement example of memory holes of a non-volatile semiconductor memory device according to a 10th embodiment.

FIG. 27 is a plan view showing an arrangement example of memory holes of a non-volatile semiconductor memory device according to a 10th embodiment;

As shown in FIG. 27, in a stacked body TA2, memory holes MH are formed, and columnar bodies PH are respectively disposed in the memory holes MH. Here, different distances A3 and B3 (A3<B3) are set between the memory holes MH in the row direction DR.

In this case, two memory holes MH arranged adjacent to each other with the distance A3 in the row direction DR may form one group GP3. In the row direction DR, other memory holes MH may be arranged one by one between the groups GP3. With this arrangement, the film formation gas for the conductive layers W0 is given wider passages between each of the slits LI and the gap spaces GA below the slit SHE', and so the film formation gas can be made to easily flow into the deep side of the gap spaces GA.

11th Embodiment

Figure 28:
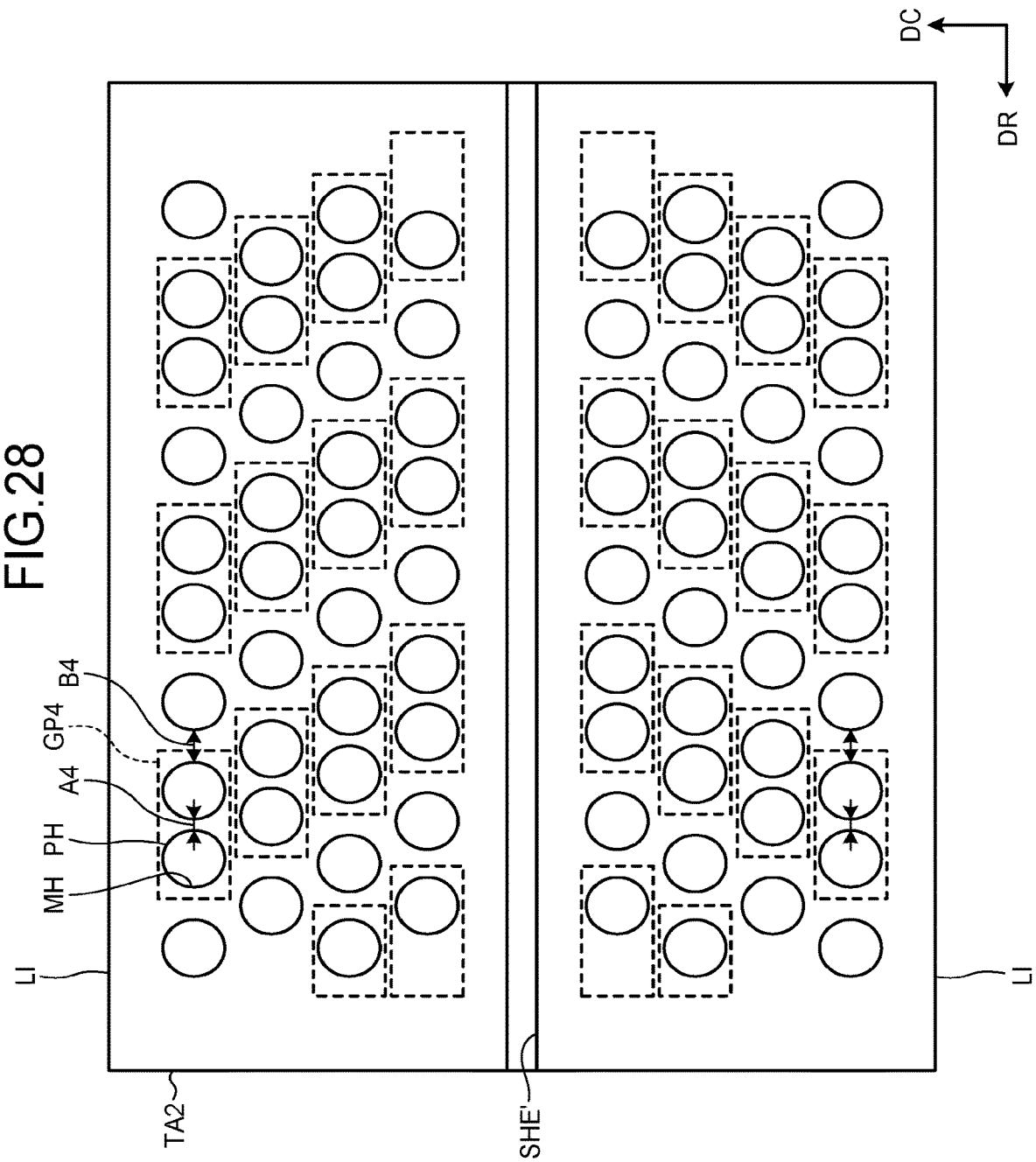
FIG. 28 is a plan view showing an arrangement example of memory holes of a non-volatile semiconductor memory device according to an 11th embodiment.

FIG. 28 is a plan view showing an arrangement example of memory holes of a non-volatile semiconductor memory device according to an 11th embodiment;

As shown in FIG. 28, in a stacked body TA2, memory holes MH are formed, and columnar bodies PH are respectively disposed in the memory holes MH. Here, different distances A4 and B4 (A4<B4) are set between the memory holes MH in the row direction DR.

In this case, two memory holes MH arranged adjacent to each other with the distance A4 in the row direction DR may form one group GP4. In the row direction DR, other memory holes MH may be arranged one by one between the groups GP4. Groups GP4 adjacent to each other in the column direction DC are arranged as being uniformly shifted in the row direction DR. With this arrangement, the film formation gas for the conductive layers W0 is given wider passages between each of the slits LI and the gap spaces GA below the slit SHE', and so the film formation gas can be made to easily flow into the deep side of the gap spaces GA.

12th Embodiment

Figure 29:
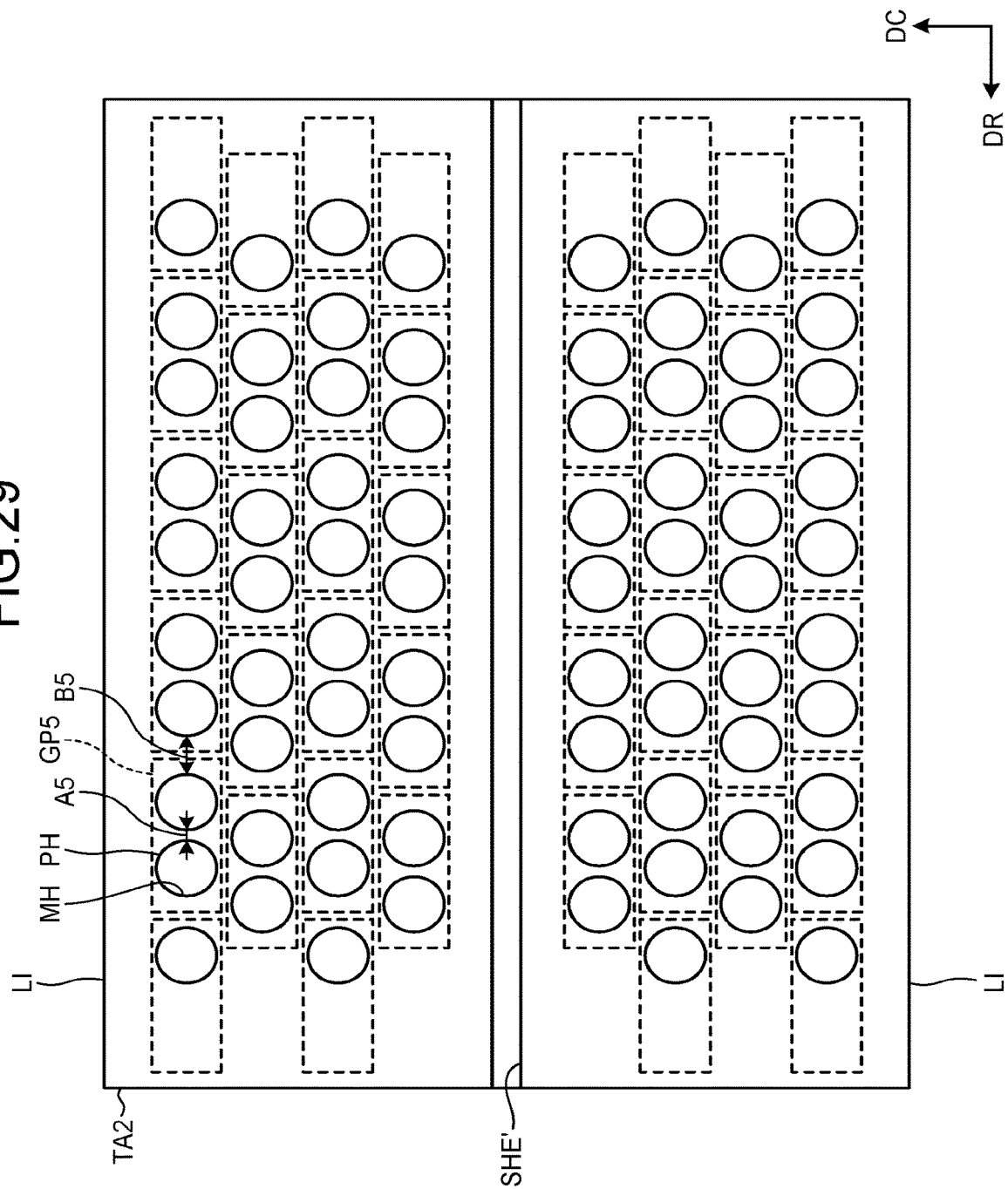
FIG. 29 is a plan view showing an arrangement example of memory holes of a non-volatile semiconductor memory device according to a 12th embodiment.

FIG. 29 is a plan view showing an arrangement example of memory holes of a non-volatile semiconductor memory device according to a 12th embodiment.

As shown in FIG. 29, in a stacked body TA2, memory holes MH are formed, and columnar bodies PH are respectively disposed in the memory holes MH. Here, different distances A5 and B5 (A5<B5) are set between the memory holes MH in the row direction DR.

In this case, two memory holes MH arranged adjacent to each other with the distance A5 in the row direction DR may form one group GP5. Groups GP5 adjacent to each other in the column direction DC are arranged as being shifted in the row direction DR at every two rows. With this arrangement, the film formation gas for the conductive layers W0 is given wider passages between each of the slits LI and the gap spaces GA below the slit SHE', and so the film formation gas can be made to easily flow into the deep side of the gap spaces GA.

13th Embodiment

Figure 30:
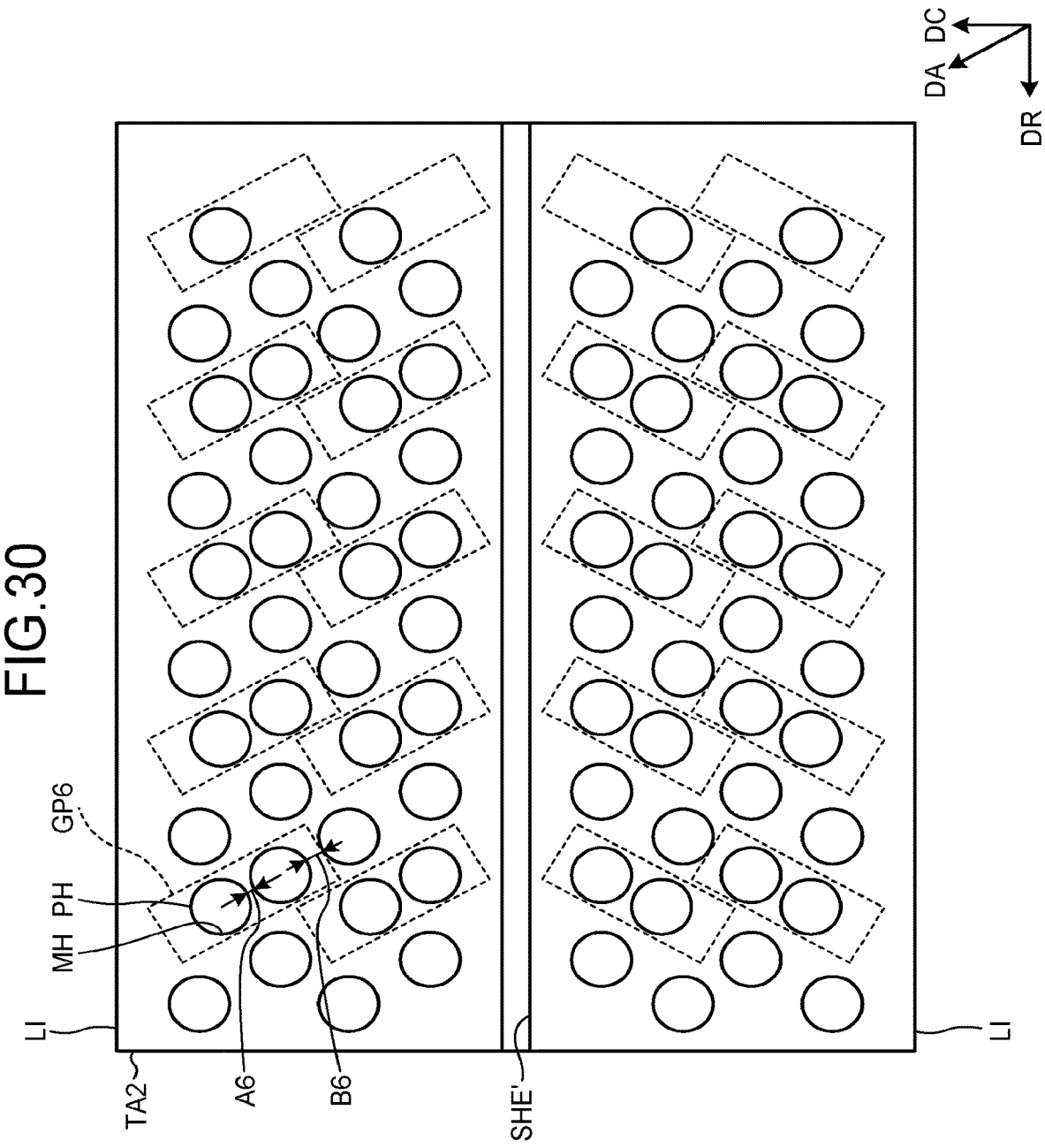
FIG. 30 is a plan view showing an arrangement example of memory holes of a non-volatile semiconductor memory device according to a 13th embodiment.

FIG. 30 is a plan view showing an arrangement example of memory holes of a non-volatile semiconductor memory device according to a 13th embodiment.

As shown in FIG. 30, in a stacked body TA2, memory holes MH are formed, and columnar bodies PH are respectively disposed in the memory holes MH. Here, different distances A6 and B6 (A6<B6) are set between the memory holes MH in an oblique direction DA relative to the row direction DR.

In this case, two memory holes MH arranged adjacent to each other with the distance A6 in the oblique direction DA may form one group GP6. With this arrangement, the film formation gas for the conductive layers W0 is given wider passages between each of the slits LI and the gap spaces GA below the slit SHE', and so the film formation gas can be made to easily flow into the deep side of the gap spaces GA.

14th Embodiment

Figure 31:
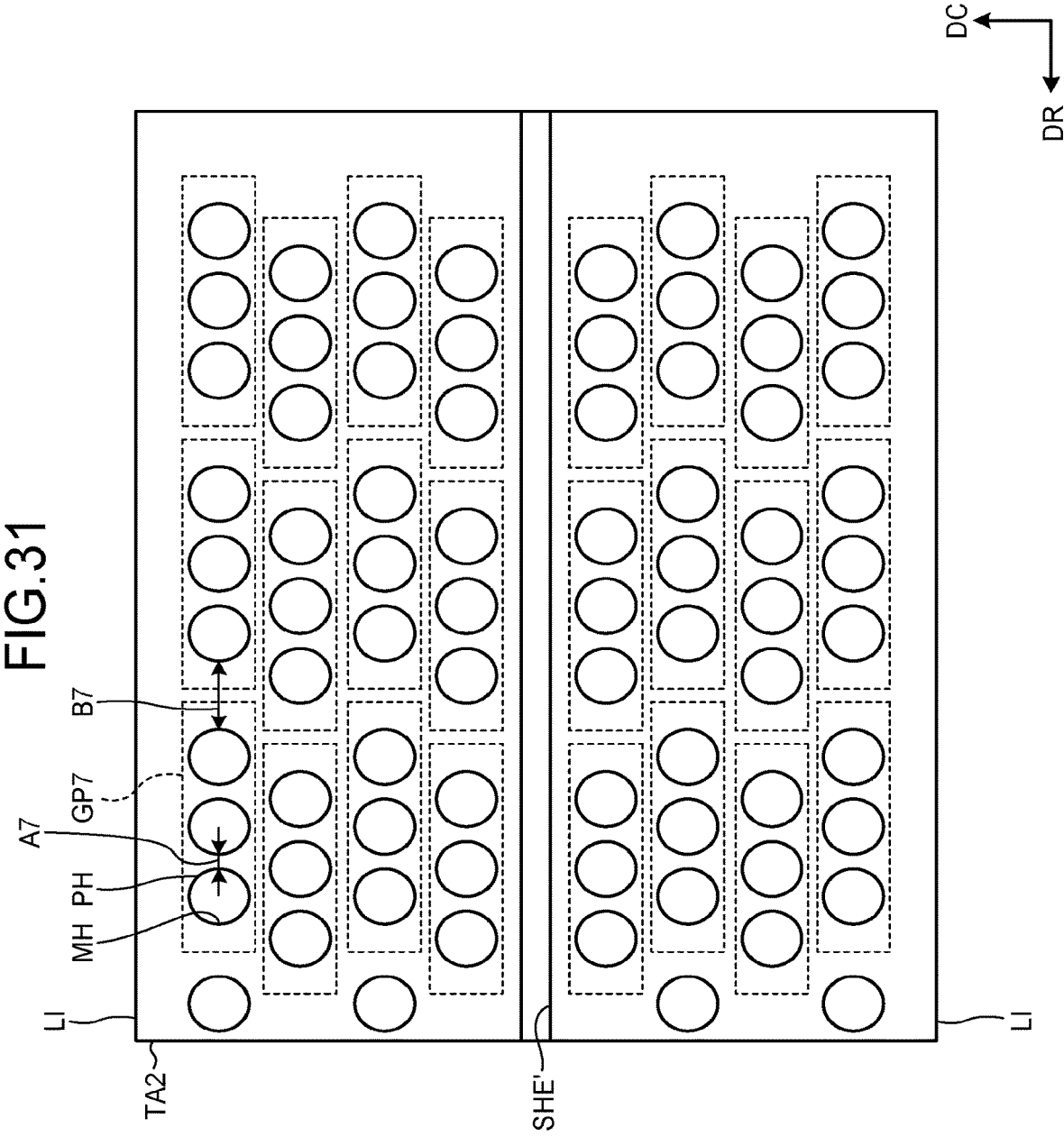
FIG. 31 is a plan view showing an arrangement example of memory holes of a non-volatile semiconductor memory device according to a 14th embodiment.

FIG. 31 is a plan view showing an arrangement example of memory holes of a non-volatile semiconductor memory device according to a 14th embodiment;

As shown in FIG. 31, in a stacked body TA2, memory holes MH are formed, and columnar bodies PH are respectively disposed in the memory holes MH. Here, different distances A7 and B7 (A7<B7) are set between the memory holes MH in the row direction DR.

In this case, three memory holes MH arranged adjacent to each other with the distance A7 in the row direction DR may form one group GP7. Groups GP7 adjacent to each other in the column direction DC are arranged as being shifted in the row direction DR at every two rows. With this arrangement, the film formation gas for the conductive layers W0 is given wider passages between each of the slits LI and the gap spaces GA below the slit SHE', and so the film formation gas can be made to easily flow into the deep side of the gap spaces GA.

15th Embodiment

Figure 32:
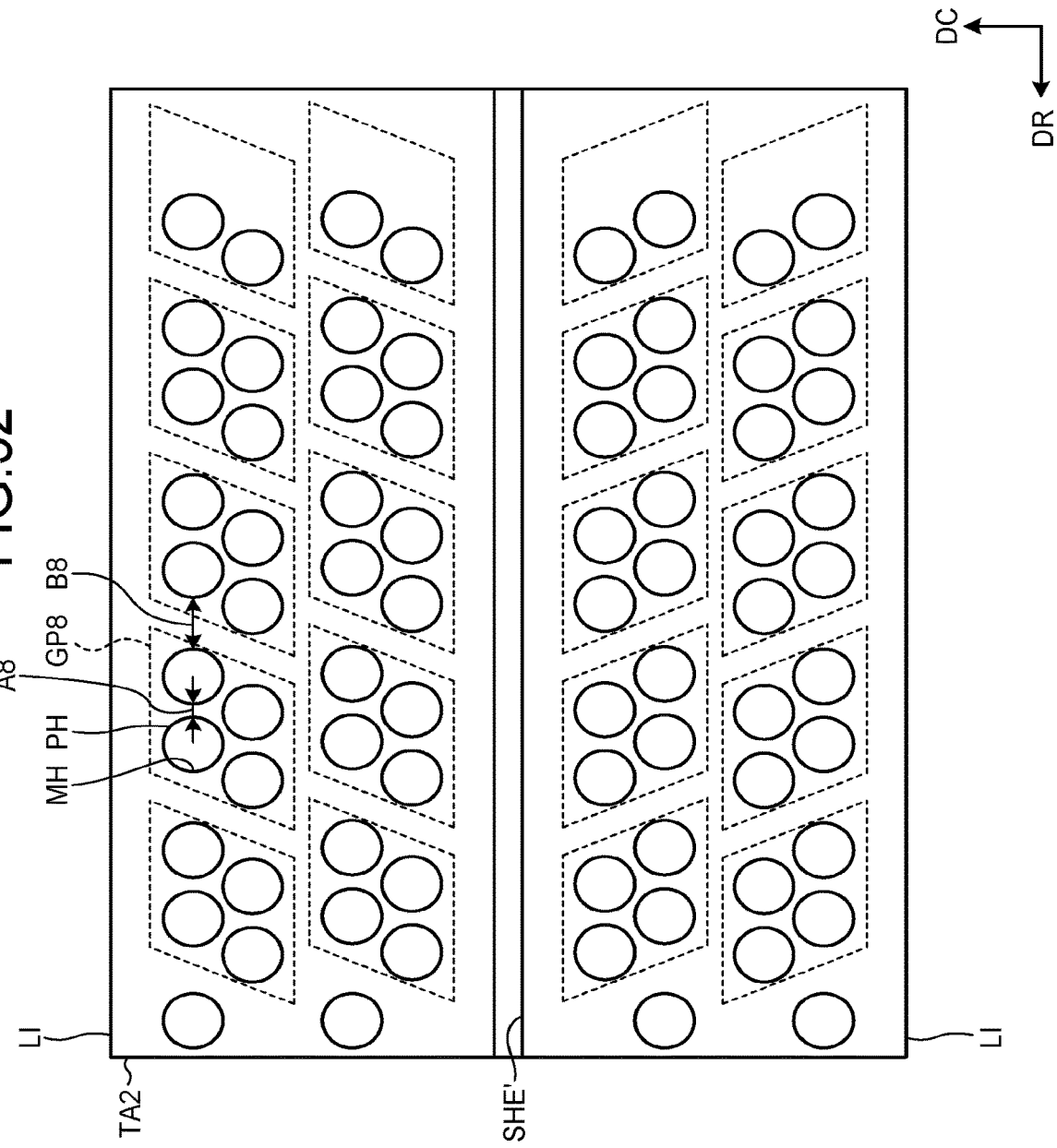
FIG. 32 is a plan view showing an arrangement example of memory holes of a non-volatile semiconductor memory device according to a 15th embodiment.

FIG. 32 is a plan view showing an arrangement example of memory holes of a non-volatile semiconductor memory device according to a 15th embodiment;

As shown in FIG. 32, in a stacked body TA2, memory holes MH are formed, and columnar bodies PH are respectively disposed in the memory holes MH. Here, different distances A8 and B8 (A8<B8) are set between the memory holes MH in the row direction DR.

In this case, four memory holes MH arranged adjacent to each other with the distance A8 in the row direction DR and the column direction DC may form one group GP8. In each of the groups GP8, the memory holes MH may be arranged as being shifted in the row direction DR and the column direction DC. With this arrangement, the film formation gas for the conductive layers W0 is given wider passages between each of the slits LI and the gap spaces GA below the slit SHE', and so the film formation gas can be made to easily flow into the deep side of the gap spaces GA.

16th Embodiment

Figure 33:
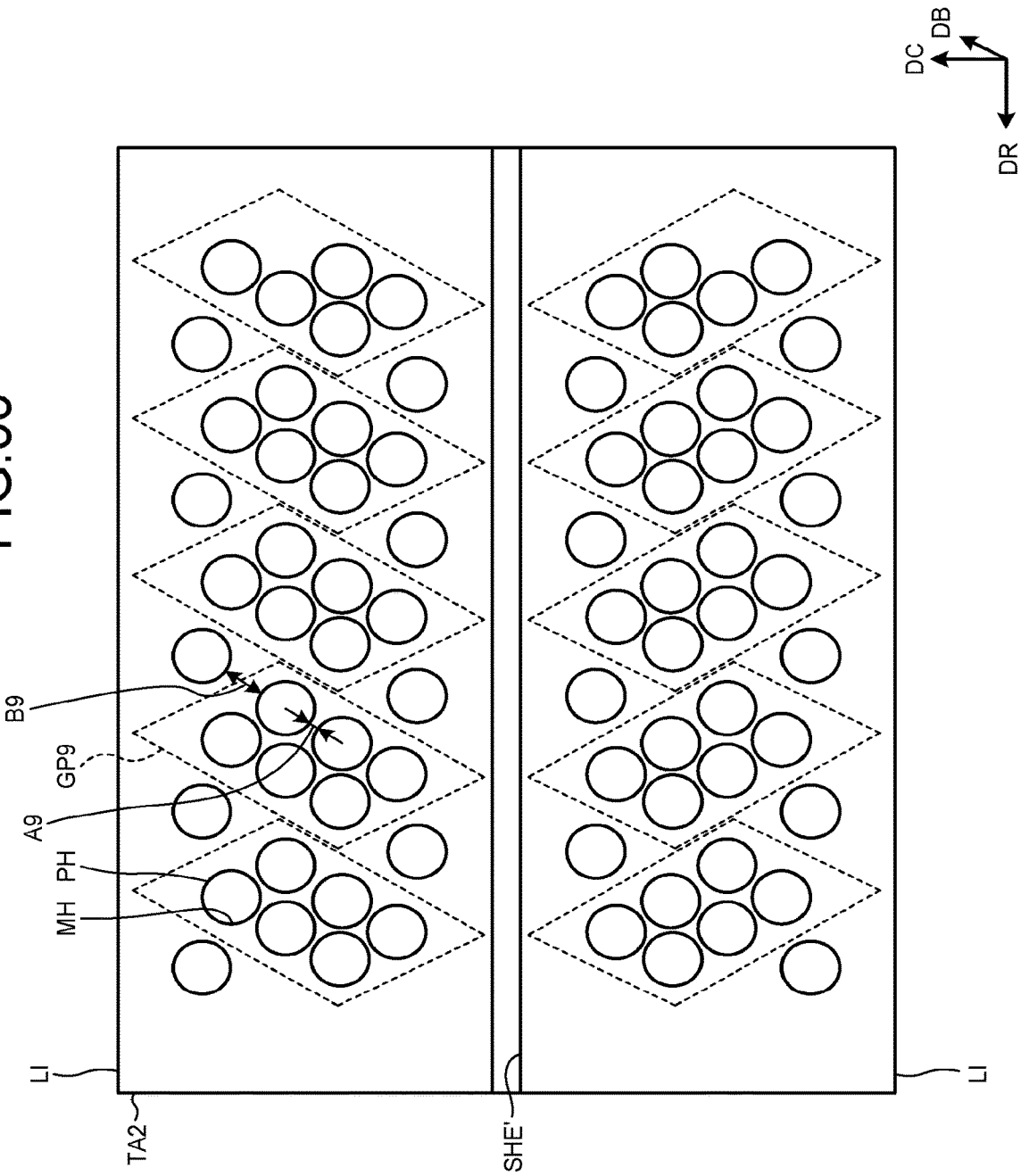
FIG. 33 is a plan view showing an arrangement example of memory holes of a non-volatile semiconductor memory device according to a 16th embodiment.

FIG. 33 is a plan view showing an arrangement example of memory holes of a non-volatile semiconductor memory device according to a 16th embodiment.

As shown in FIG. 33, in a stacked body TA2, memory holes MH are formed, and columnar bodies PH are respectively disposed in the memory holes MH. Here, different distances A9 and B9 (A9<B9) are set between the memory holes MH in an oblique direction DB relative to the row direction DR.

In this case, six memory holes MH arranged adjacent to each other with the distance A9 in the row direction DR and the column direction DC may form one group GP9. In each of the groups GP9, the memory holes MH may be arranged as being shifted in the row direction DR and the column direction DC. With this arrangement, the film formation gas for the conductive layers W0 is given wider passages between each of the slits LI and the gap spaces GA below the slit SHE', and so the film formation gas can be made to easily flow into the deep side of the gap spaces GA.

17th Embodiment

Figure 34A:
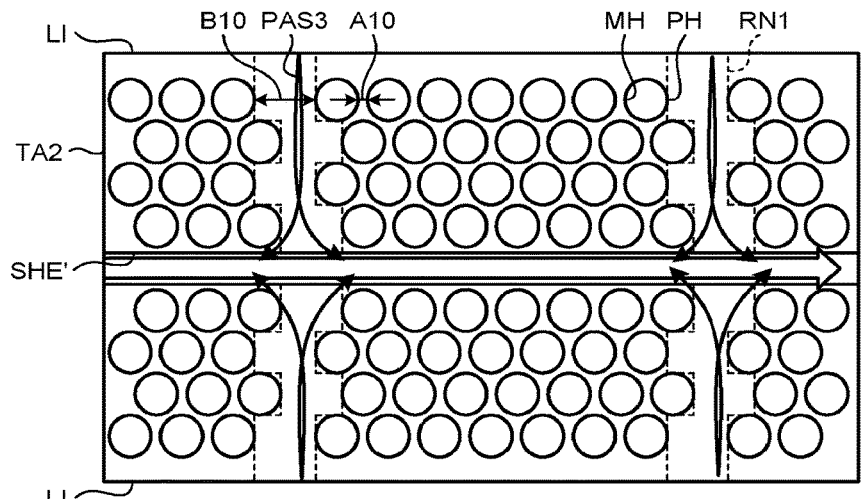
FIG. 34A is a plan view showing an arrangement example of memory holes of a non-volatile semiconductor memory device according to a 17th embodiment.

FIG. 34A is a plan view showing an arrangement example of memory holes of a non-volatile semiconductor memory device according to a 17th embodiment.

As shown in FIG. 34A, in a stacked body TA2, a slit SHE' is formed. Slits LI are respectively formed on both sides of the slit SHE'. Further, in the stacked body TA2, memory holes MH are formed, and columnar bodies PH are respectively disposed in the memory holes MH. Here, different distances A10 and B10 (A10<B10) are set between the memory holes MH in the row direction DR.

In this case, non-arrangement regions RN1 formed by excluding some of the memory holes MH are disposed between the memory holes MH. The width of each of the non-arrangement regions RN1 may be set to the distance B10. The non-arrangement regions RN1 may be arranged perpendicular to the slit SHE', between the slit SHE' and each of the slits LI. Here, within each of the places surrounded by the slits SHE' and LI and the non-arrangement regions RN1, memory holes MH may be arrayed in a square arrangement or staggered arrangement in a horizontal plane defined by two axes in the row direction DR and the column direction DC. With this arrangement, the film formation gas for the conductive layers W0 is given wider passages PAS3 between each of the slits LI and the gap spaces GA below the slit SHE', and so the film formation gas can be made to easily flow into the deep side of the gap spaces GA.

18th Embodiment

Figure 34B:
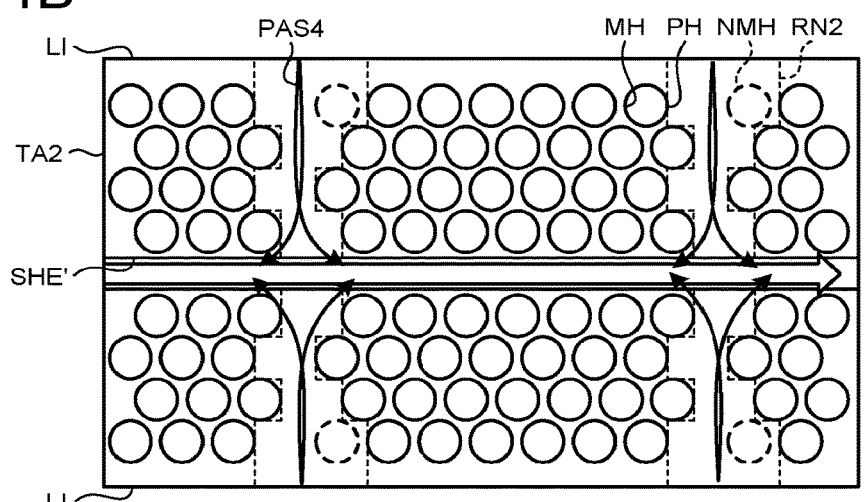
FIG. 34B is a plan view showing an arrangement example of memory holes of a non-volatile semiconductor memory device according to an 18th embodiment.

FIG. 34B is a plan view showing an arrangement example of memory holes of a non-volatile semiconductor memory device according to an 18th embodiment.

In the configuration shown in FIG. 34B, non-arrangement regions RN2 are disposed in place of the non-arrangement regions RN1 shown in FIG. 34A. Each of the non-arrangement regions RN2 is formed by excluding some of the memory holes MH in the same way as each of the non-arrangement regions RN1, and further by excluding another memory hole NMH. The memory holes NMH may be arranged adjacent to the slits LI. Here, since the non-arrangement regions RN2 exclude the memory holes NMH, the frontages of the non-arrangement regions RN2 facing the slits LI are expanded. With this arrangement, the film formation gas for the conductive layers W0 is given wider passages PAS4 between each of the slits LI and the gap spaces GA below the slit SHE', and the film formation gas can easily enter the passages PAS4 from the slits LI, and so the film formation gas can be made to more easily flow into the deep side of the gap spaces GA.

19th Embodiment

Figure 34C:
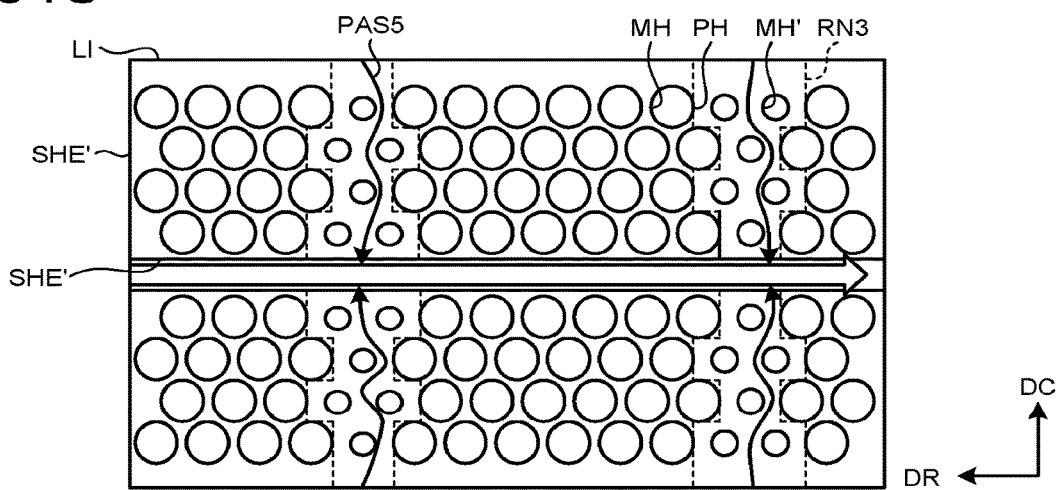
FIG. 34C is a plan view showing an arrangement example of memory holes of a non-volatile semiconductor memory device according to a 19th embodiment.

FIG. 34C is a plan view showing an arrangement example of memory holes of a non-volatile semiconductor memory device according to a 19th embodiment.

In the configuration shown in FIG. 34C, non-arrangement regions RN3 are disposed in place of the non-arrangement regions RN1 shown in FIG. 34A. Each of the non-arrangement regions RN3 is formed by excluding some of the memory holes MH in the same way as each of the non-arrangement regions RN1, and further by including small holes MH' formed therein. The diameter of the small holes MH' may be set smaller than the diameter of the memory holes MH. The small holes MH' may be continuously arranged at regular intervals between the slit SHE' and each of the slits LI.

With this arrangement, the film formation gas for the conductive layers W0 is given wider passages PAS5 between each of the slits LI and the gap spaces GA below the slit SHE', and so the film formation gas can be made to easily flow into the deep side of the gap spaces GA. Further, since the small holes MH' are arranged in the non-arrangement regions RN3, the periodicity of the arrangement positions of the memory holes MH becomes less disordered, and so the uniformity of the shape of the memory holes MH is improved. Consequently, the difference in writing characteristic and erasing characteristic between the memory cells MC and the difference in threshold between the memory cells MC can be reduced, and thereby the reliability of the memory cells MC can be improved.

20th Embodiment

FIGS. 35A and 35B are plan views showing an arrangement method of memory holes of a non-volatile semiconductor memory device according to a 20th embodiment. Here, FIGS. 35A and 35B show a case where memory holes MH and dummy holes DMH are arrayed in a staggered arrangement at every four rows.

As shown in FIGS. 35A and 35B, the memory holes MH and the dummy holes DMH are arranged on a semiconductor substrate SE. Columnar bodies PH are respectively embedded in the memory holes MH and the dummy holes DMH. The memory holes MH and the dummy holes DMH may be arrayed in a square arrangement or staggered arrangement in a horizontal plane defined by two axes in the row direction DR and the column direction DC.

The staggered arrangements, each of which is formed of four rows of the memory holes MH and the dummy holes DMH, are separated from each other by slits LI extending in the row direction DR. Bit lines BL extending in the column direction DC are disposed above the memory holes MH. Further, a shunt zone SU is disposed in parallel with the bit lines BL, on the semiconductor substrate SE. Here, in the shunt zone SU, contacts to the semiconductor substrate SE may be formed, for example. The dummy holes DMH may be arranged in the shunt zone SU. The bit lines BL may be arranged not to be present on the shunt zone SU.

Here, as shown in FIG. 35B, contacts CH1 are disposed on the memory holes MH and connected to the bit lines BL. Contacts CH1 connected to the bit lines BL are not disposed on the dummy holes DMH. A source line SL extending in the column direction DC is disposed above the dummy holes DMH. Conductive plates PI extending in the row direction DR are respectively disposed in the slits LI. As the material of the conductive plates PI, for example, W may be used. The source line SL is connected to the conductive plates PI via contacts CH2.

Instead of the non-arrangement regions RN1 excluding the memory holes MH as shown in FIG. 34A, non-arrangement regions formed by excluding some of the dummy holes DMH may be disposed in the shunt zone SU. Alternatively, instead of the non-arrangement regions RN2 excluding the memory holes MH as shown in FIG. 34B, non-arrangement regions formed by excluding some of the dummy holes DMH may be disposed in the shunt zone SU. Alternatively, instead of the non-arrangement regions RN3 excluding the memory holes MH as shown in FIG. 34C, non-arrangement regions formed by excluding some of the dummy holes DMH may be disposed in the shunt zone SU, such that these non-arrangement regions include small dummy holes having a diameter smaller than that of the dummy holes DMH.

With this arrangement, the film formation gas for the conductive layers W0 is given wider passages, without removing some of the memory holes MH, and so the film formation gas can be made to more easily flow into the deep side of the gap spaces GA, without increasing the chip size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a stack including a plurality of conductive layers and a plurality of insulating layers alternately stacked in a first direction, the plurality of conductive layers including a first conductive layer as a selection gate electrode and a plurality of second conductive layers as word lines;
   a slit dividing the first conductive layer into a first region and a second region in a second direction crossing the first direction and extending in a third direction crossing the first and the second directions, the slit not dividing the plurality of second conductive layers, the slit including an insulating material;
   a plurality of first columns respectively extending in the first direction through the first region of the first conductive layer and respectively including a first charge accumulating layer;
   a plurality of second columns respectively extending in the first direction through the second region of the first conductive layer and respectively including a second charge accumulating layer;
   a plurality of first plug electrodes provided on the plurality of first columns; and
   a plurality of second plug electrodes provided on the plurality of second columns,
   wherein
   the slit has a first surface that faces the first region of the first conductive layer and a second surface that faces the second region of the first conductive layer,
   the first columns and the second columns are arranged at a pitch in the third direction, and
   the first surface and the second surface have waveform shapes that are shifted from each other by a half of the pitch in the third direction.

2. The semiconductor device according to claim 1, wherein
   the plurality of first columns and the plurality of second columns are disposed opposite to each other with the slit interposed therebetween.

3. The semiconductor device according to claim 1, wherein
   the plurality of first columns and the plurality of second columns that are disposed opposite to each other with the slit interposed therebetween are shifted from each other by the half of the pitch in the third direction.

4. The semiconductor device according to claim 1, wherein
   a minimum value of a width of the slit is smaller than a distance between two adjacent ones of the plurality of first columns or the plurality of second columns.

5. The semiconductor device according to claim 1, wherein
   the first and the second surfaces of the slit have a spatial period equal to the pitch in the third direction.

6. The semiconductor device according to claim 1, wherein
   a diameter of each of the plurality of first columns and the plurality of second columns is 90 to 110 nm.
7. The semiconductor device according to claim 1, wherein
   a distance between two adjacent ones of the plurality of first columns or the plurality of second columns is 40 to 60 nm.
8. The semiconductor device according to claim 1, wherein
   a minimum value of a width of the slit is 40 nm or less.

* * * * *